(12) United States Patent
Nishimura et al.

(10) Patent No.: US 11,071,202 B2
(45) Date of Patent: Jul. 20, 2021

(54) HIGH-FREQUENCY CIRCUIT LAMINATE AND METHOD FOR PRODUCING SAME, AND B-STAGE SHEET

(71) Applicant: JSR CORPORATION, Minato-ku (JP)

(72) Inventors: Isao Nishimura, Minato-ku (JP);
Nobuyuki Miyaki, Minato-ku (JP);
Toshiaki Kadota, Minato-ku (JP);
Shintarou Fujitomi, Minato-ku (JP);
Tomotaka Shinoda, Minato-ku (JP)

(73) Assignee: JSR CORPORATION, Minato-ku (JP)

( * ) Notice: Subject to any disclaimer, the term of this patent is extended or adjusted under 35 U.S.C. 154(b) by 0 days.

(21) Appl. No.: 16/647,119

(22) PCT Filed: Sep. 10, 2018

(86) PCT No.: PCT/JP2018/033477
§ 371 (c)(1),
(2) Date: Mar. 13, 2020

(87) PCT Pub. No.: WO2019/054334
PCT Pub. Date: Mar. 21, 2019

(65) Prior Publication Data
US 2020/0281076 A1    Sep. 3, 2020

(30) Foreign Application Priority Data

Sep. 15, 2017 (JP) .............................. JP2017-177600
Sep. 15, 2017 (JP) .............................. JP2017-177601

(51) Int. Cl.
*H05K 1/11* (2006.01)
*B32B 15/08* (2006.01)
(Continued)

(52) U.S. Cl.
CPC .............. *H05K 1/118* (2013.01); *B32B 15/08* (2013.01); *H05K 1/0237* (2013.01); *H05K 1/03* (2013.01)

(58) Field of Classification Search
CPC ........ H05K 1/118; H05K 1/0237; H05K 1/03; H05K 1/11
(Continued)

(56) References Cited

U.S. PATENT DOCUMENTS

2009/0266591 A1*  10/2009  Amou ................... H05K 1/0366
                                                                    174/258
2012/0139655 A1    6/2012  Lin et al.
(Continued)

FOREIGN PATENT DOCUMENTS

JP    2001-301088 A    10/2001
JP    2008-39703 A      2/2008
(Continued)

OTHER PUBLICATIONS

International Search Report dated Nov. 6, 2018, in PCT/JP2018/033477, citing documents AD,AN,AP,AS, and AV therein, 2 pages.
(Continued)

*Primary Examiner* — Tremesha S Willis
(74) *Attorney, Agent, or Firm* — Oblon, McClelland, Maier & Neustadt, L.L.P.

(57) ABSTRACT

Provided is a high-frequency circuit laminate that can reduce the transmission loss of electrical signals in high-frequency circuits and produce circuit boards with excellent smoothness.
The high-frequency circuit laminate according to the present invention includes a metal layer and a resin layer which are laminated in contact with each other, the resin layer having an elastic modulus from 0.1 to 3 GPa, and the resin layer
(Continued)

having an dielectric loss tangent from 0.001 to 0.01 and a relative permittivity from 2 to 3 at a frequency of 10 GHz at 23° C.

20 Claims, 4 Drawing Sheets

(51) Int. Cl.
  H05K 1/02 (2006.01)
  H05K 1/03 (2006.01)
(58) Field of Classification Search
  USPC .......................................................... 174/258
  See application file for complete search history.

(56) References Cited

U.S. PATENT DOCUMENTS

| | | |
|---|---|---|
| 2012/0175154 A1 | 7/2012 | Matsuda |
| 2013/0306358 A1 | 11/2013 | Ohmori et al. |
| 2014/0295159 A1 | 10/2014 | Kawasaki et al. |
| 2014/0326487 A1 | 11/2014 | Ozeki et al. |
| 2015/0016072 A1 | 1/2015 | Iwayama et al. |
| 2016/0044784 A1 | 2/2016 | Matsuda |
| 2016/0044797 A1 | 2/2016 | Matsuda |
| 2017/0188453 A1 | 6/2017 | Sugimoto et al. |
| 2018/0009195 A1 | 1/2018 | Takeuchi et al. |
| 2020/0324538 A1* | 10/2020 | Nishiyama ............. B32B 7/022 |

FOREIGN PATENT DOCUMENTS

| | | |
|---|---|---|
| JP | 2008-284716 A | 11/2008 |
| JP | 2009-231770 A | 10/2009 |
| JP | 2011-40727 A | 2/2011 |
| JP | 2014-197611 A | 10/2014 |
| JP | 2015-176921 A | 10/2015 |
| JP | 2016-32098 A | 3/2016 |
| JP | 2016-87799 A | 5/2016 |
| WO | WO 2012/014339 A1 | 2/2012 |
| WO | WO 2016/114287 A1 | 7/2016 |

OTHER PUBLICATIONS

U.S. Appl. No. 16/647,350, filed Mar. 13, 2020, Isao Nishimura.
Office Action dated Aug. 26, 2020 in co-pending U.S. Appl. No. 16/647,350.
Office Action dated Feb. 4, 2021, in co-pending U.S. Appl. No. 16/647,350, (References AA, AB and AC are cited therein).
International Search Report dated Nov. 27, 2018 in PCT/JP2018/033480. (References AO and AP are cited therein).
Extend European Search Report dated May 4, 2021, in European Patent Application No. 18856760.6 (7 pages).
Supplementary European Search Report dated May 26, 2021, in European Patent Application No. 18856178.1 filed Sep. 10, 2018, 8 pages.

* cited by examiner

HIGH-FREQUENCY CIRCUIT LAMINATE AND METHOD FOR PRODUCING SAME, AND B-STAGE SHEET

FIELD OF INVENTION

The present invention relates to a high-frequency circuit laminate formed by bonding a resin layer and a metal layer, and a method for producing the same, and a B-stage sheet. The present invention also relates to a laminate roll that is suitably used as a high-frequency circuit board.

BACKGROUND ART

With the recent increase in the performance of information terminal equipment and dramatic advances in network technology, the frequency of electric signals handled in the information communication field has been increasing toward high speed and large capacity transmission. In order to address this, there is an increasing demand for low dielectric constant (low $\varepsilon_r$) and low dielectric loss tangent (low tan δ) materials that can reduce the transmission loss, which is a problem when transmitting and processing high-frequency signals and high-speed digital signals to the printed wiring boards used (for example, see Patent Documents 1 to 4).

As printed wiring boards, a flexible printed circuit board (hereinafter also referred to as "FPC") and a flexible flat cable (hereinafter also referred to as "FFC") are used for electronic and electric devices. The FPC is produced by the steps of processing a copper clad laminate (CCL) including an insulator layer and a copper foil layer to form an electrical circuit, and then attaching an adhesive portion of a coverlay (CL) including an insulating layer and an adhesive layer to the circuit portion to protect the circuit portion. Additionally, FFC is an electrical circuit obtained by using a substrate made of an insulator layer and an adhesive layer and a conductor such as copper foil formed in a wiring form, arranging a plurality of conductors between the adhesive parts of the substrate, and bonding.

CITATION LIST

Patent Literature

Patent Document 1: JP 2014-197611 A
Patent Document 2: JP 2015-176921 A
Patent Document 3: JP 2016-087799 A
Patent Document 4: JP 2016-032098 A

SUMMARY OF INVENTION

Technical Problem

However, electrical signals tend to be attenuated at higher frequencies, and the transmission loss tends to increase. Therefore, mounting boards for next-generation high-frequency (10 GHz or greater), low dielectric for reducing crosstalk between wires and low dielectric loss characteristics for suppressing the transmission loss of electrical signals have become indispensable characteristics for insulator materials. Furthermore, in order to suppress the transmission loss of electrical signals, it is also important that the mounting substrate has excellent smoothness. In particular, in FPC and FFC, an adhesive is used to laminate the resin layer and the metal layer, but the adhesive layer formed by the adhesive is considered to be one of the causes of impairing the low dielectric loss characteristics and the smoothness of the mounting substrate.

Furthermore, when a laminate of a resin layer and a metal layer with an adhesive interposed therebetween is stored in the form of a roll wound around a core, the adhesive layer is deteriorated and hardened due to external factors (for example, storage environment), so that the laminate has a problem that it tends to be curled when pulled out.

The present invention has been made in view of the above circumstances, and an object of the present invention is to provide a high-frequency circuit laminate capable of reducing a transmission loss of an electric signal in a high-frequency circuit and producing a circuit board having excellent smoothness. Another object of the present invention is to provide a method for producing a high-frequency circuit laminate which can be produced by bonding at a low temperature and achieves excellent adhesion between a resin layer and a metal layer.

Yet another object of the present invention is to provide a laminate roll that can effectively suppress curling even when the high-frequency circuit laminate, which is capable of reducing the transmission loss of high frequency signals, is wound around a core and stored.

Solution to Problem

The present invention has been made to achieve at least part of the above object, and can be achieved as the following embodiments or the application examples.

Application Example 1

An embodiment of the high-frequency circuit laminate according to the present invention includes a metal layer and a resin layer which are laminated in contact with each other, the resin layer having an elastic modulus ranges from 0.1 to 3 GPa, and the resin layer having a dielectric loss tangent ranges from 0.001 to 0.01 and a relative permittivity from 2 to 3 at a frequency of 10 GHz at 23° C.

Application Example 2

The high-frequency circuit laminate according to Application Example 1, in which a peel strength between the resin layer and the metal layer may be 5 N/cm or greater.

Application Example 3

The high-frequency circuit laminate according to Application Example 1 or 2, in which a thickness of the resin layer is from 10 to 100 μm, and a thickness of the metal layer is from 10 to 50 μm.

Application Example 4

The high-frequency circuit laminate according to any one of Application Examples 1 to 3, may have a thickness from 50 to 200 μm.

Application Example 5

An embodiment of the flexible printed circuit board according to the present invention includes the high-frequency circuit laminate described in any one of Application Examples 1 to 4.

Application Example 6

An embodiment of the laminate roll according to the present invention includes the high-frequency circuit laminate described in any one of Application Examples 1 to 4, in which the high-frequency circuit laminate is wound around a core having a radius from 10 to 100 mm.

Application Example 7

An embodiment of the method for producing a high-frequency circuit laminate according to the present invention includes the step of bonding a B-stage resin layer having a surface roughness Ra from 1 to 100 nm to a metal layer having a surface roughness Ra of 10 to 300 nm by heating to 50 to 200° C. under a linear load of 1 to 19 kN/m.

Application Example 8

An embodiment of the B-stage sheet according to the present invention includes a B-stage resin layer and a release layer formed on at least one surface of the B-stage resin layer, wherein the B-stage resin layer is cured to become a C-stage resin layer having an elastic modulus of 0.1 to 3 GPa, and the C-stage resin layer having a dielectric loss tangent from 0.001 to 0.01 and a relative permittivity from 2 to 3 at a frequency of 10 GHz at 23° C.

Effect of the Invention

The high-frequency circuit laminate according to the present invention reduces the transmission loss of electric signals in a high-frequency circuit, and allows production of a circuit board having excellent smoothness. Furthermore, the method for producing a high-frequency circuit laminate according to the present invention allows production of a high-frequency circuit laminate that can be produced by bonding at low temperatures and have excellent adhesion between the resin layer and the metal layer. Furthermore, the laminate roll according to the present invention can effectively suppress curling even when the high-frequency circuit laminate capable of reducing the transmission loss of high frequency signals is wound around a core and stored.

DESCRIPTION OF EMBODIMENTS

Figure 1A:
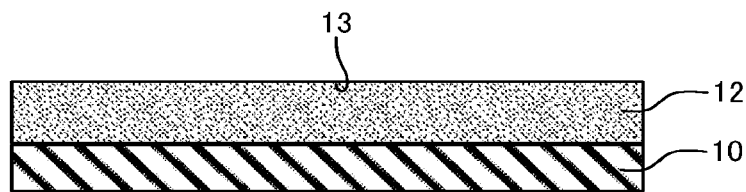
FIG. 1A is a cross-sectional view schematically illustrating the step A1 in Production Example A of the high-frequency circuit laminate.

Preferred embodiments according to the present invention will be described below in detail. It should be understood that the present invention is not limited to only the embodiments described below, but also includes various modifications that are made without departing from the spirit of the present invention.

In this specification, a numerical range described with "from A to B" is meant to include a numerical value A as a lower limit value and a numerical value B as an upper limit value.

1. HIGH-FREQUENCY CIRCUIT LAMINATE

The terms used in the present specification are defined as follows.

The "high-frequency signal" refers to an electric signal or a radio wave having a frequency of 10 GHz or greater.

The "high-frequency circuit laminate" refers to a laminated body used when producing a high-frequency circuit driven at a frequency of 10 GHz or greater.

The "B-stage resin layer" refers to a layer in which the resin is semi-cured.

The "C-stage resin layer" refers to a layer in which the resin is completely cured. Note that in the present invention, the "C stage resin layer" may be simply referred to as a "resin layer".

The "roll" refers to a high-frequency circuit laminate having a uniform width wound around a core by a predetermined length The winding length and width are not particularly limited, but typically the winding length is from 0.5 to 100 m and the width is from several tens to 1000 mm.

The high-frequency circuit laminate according to the present embodiment is formed by laminating a metal layer and a resin layer in contact with each other, and does not include an adhesive layer such as a primer resin layer between the metal layer and the resin layer. In a general circuit laminate, an adhesive layer is interposed between the resin layer and the metal layer in order to improve the adhesion between the metal layer having the conductive function and the resin layer having the insulating function. The adhesive layer is formed by a method such as application using an adhesive mainly containing a polymer having a polar functional group. However, such an adhesive layer has poor electrical characteristics, so that the effective dielectric constant and effective dielectric loss of the resin layer having an insulating function are increased, and are not suitable for high-frequency circuits. In contrast, the high-frequency circuit laminate according to the present embodiment has good adhesion between the metal layer and the resin layer without using an adhesive, and the metal layer and the resin layer are laminated in contact with each other. As a result, a laminate suitable for a high-frequency circuit was successfully obtained without deteriorating the effective electrical characteristics of the resin layer.

In the high-frequency circuit laminate used in the present embodiment, the peel strength between the resin layer and the metal layer is preferably 5 N/cm or greater, more preferably 5.3 N/cm or greater, and particularly preferably 6 N/cm or greater. Since the high-frequency circuit laminate used in the present embodiment has a peel strength in the above-described range, the adhesion between the metal layer and the resin layer is good even without using an adhesive. Note that the peel strength can be measured in accordance with the method described in "IPC-TM-650 2.4.9".

The thickness of the high-frequency circuit laminate used in the present embodiment is preferably from 50 to 200 μm, more preferably from 60 to 180 μm, and particularly preferably from 70 to 150 μm. When the thickness of the high-frequency circuit laminate is within the aforementioned range, the high-frequency circuit laminate with a small thickness is produced, and it will not easily curled when wound around a core.

In addition, when a step is formed on the core, the thickness of the high-frequency circuit laminate is particularly preferably the height of the step (μm)+10 μm. When the thickness of the high-frequency circuit laminate is within the above range, the step at the joint between the step of the core and the high-frequency circuit laminate is eliminated, so that the formation of the impression of the laminate roll is more effectively suppressed.

Hereinafter, the configuration and production method of each layer constituting the high-frequency circuit laminate according to the present embodiment will be described in detail.

1.1. Resin Layer

The high-frequency circuit laminate according to the present embodiment includes a resin layer. The elastic modulus of the resin layer is from 0.1 to 3 GPa, and preferably from 0.2 to 2.5 GPa. When the elastic modulus of the resin layer is within the above range, a high-frequency circuit laminate having excellent flexibility can be obtained, so that a circuit board can be produced under more free conditions. The elastic modulus of the resin layer is a tensile modulus of elasticity, and can be measured in accordance with JIS K7161.

The relative permittivity of the resin layer at a frequency of 10 GHz at 23° C. is from 2 to 3, and preferably from 2.1 to 2.8. In addition, the dielectric loss tangent of the resin layer at a frequency of 10 GHz at 23° C. is from 0.001 to 0.01, and preferably from 0.002 to 0.009. When the relative permittivity and the dielectric loss tangent are within the above ranges, a circuit board having excellent high-frequency characteristics can be produced. The relative permittivity and the dielectric loss tangent of the resin layer at a frequency of 10 GHz at 23° C. can be measured using a cavity resonator perturbation method dielectric constant measurement device.

In addition, the thickness of the resin layer is preferably from 10 to 100 μm, more preferably from 20 to 90 μm, and particularly preferably from 25 to 80 μm.

The present invention also includes an embodiment in which the resin layer is composed of a plurality of different resin layers. When the resin layer includes a plurality of resin layers, the elastic modulus, relative permittivity, and dielectric loss tangent of each resin layer need not necessarily be limited to the preferable ranges described above, and is required to be in a preferred range as a whole.

The method for producing the resin layer is not particularly limited, and it can be produced by a method such as applying the resin layer composition to a substrate such as a release layer or a metal foil, or extruding the composition to produce a self-standing film.

The composition of the resin layer composition is not particularly limited as long as the resin layer to be obtained has a composition satisfying the elastic modulus, the dielectric loss tangent, and the relative permittivity described above, and preferably contain a polymer, a curable compound, and as necessary, a curing aid and a solvent.

1.1.1. Resin Layer Composition

<Polymer>

As the polymer that can be included in the resin layer composition, for example, a known material having low dielectric constant and low dielectric loss tangent characteristics such as an epoxy resin, a polyimide, or a polyarylene may be used as appropriate. In particular, a polymer having a repeating unit represented by at least one of the following formulas (1-1), (1-2) and (1-3) are preferably used.

[Formula 1]

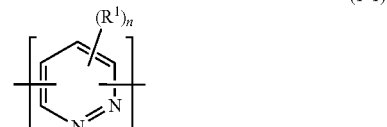

(1-1)

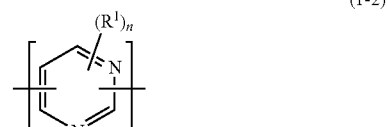

(1-2)

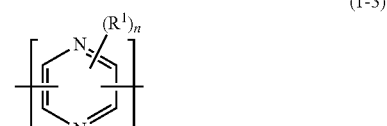

(1-3)

[Wherein in the formulas (1-1) to (1-3), $R^1$ are each independently a halogen atom, a monovalent hydrocarbon group having 1 to 20 carbon atoms, a monovalent halogenated hydrocarbon group having 1 to 20 carbons, a nitro group, a cyano group, any of primary to tertiary amino groups, or any of salts of primary to tertiary amino groups. The n is each independently an integer of 0 to 2. In a case where n is 2, the plurality of $R^1$s may be the same or different, and may be bonded in any combination to form part of a ring structure.]

The $R^1$ is preferably a halogen atom, a monovalent hydrocarbon group having 1 to 6 carbon atoms, a monovalent halogenated hydrocarbon group having 1 to 6 carbon atoms, a nitro group, a cyano group, a primary to tertiary amino group, or a salt of a primary to tertiary amino group, and more preferably a fluorine atom, a chlorine atom, a methyl group, a nitro group, a cyano group, a t-butyl group, a phenyl group, or an amino group. The n is preferably 0 or 1, and more preferably 0.

The position of the other bond with respect to one bond of the repeating unit is not particularly limited, but the meta position is preferred from the viewpoint of improving the polymerization reactivity of the monomer giving the repeating unit. The repeating unit is preferably a structural unit having a pyrimidine skeleton and represented by the above formula (1-2).

The polymer may have a repeating unit other than the repeating unit represented by at least one of the above formulas (1-1), (1-2) and (1-3) as necessary, and the content ratio of the repeating unit represented by at least one of the above formulas (1-1), (1-2) and (1-3) in the polymer is preferably from 5 to 95 mol %, and more preferably from 10 to 60 mol % when the total of all the structural units in the polymer is 100 mol %.

The method for synthesizing the polymer having a repeating unit represented by at least one of the above formulas (1-1), (1-2) and (1-3) is not particularly limited, and may be a known method. For example, it can be synthesized by heating a monomer that provides a repeating unit represented by at least one of the above formulas (1-1), (1-2) and (1-3) and other monomer as necessary in an organic solvent together with an alkali metal or the like.

The lower limit of the weight average molecular weight (Mw) of the polymer having a repeating unit represented by at least one of the above formulas (1-1), (1-2) and (1-3) is preferably 500, more preferably 1000, still more preferably 10000, and particularly preferably 30000. The upper limit of the weight average molecular weight (Mw) is preferably 600000, more preferably 400000, even more preferably 300000, and particularly preferably 200000.

The lower limit of the glass transition temperature (Tg) of the polymer having a repeating unit represented by at least one of the above formulas (1-1), (1-2) and (1-3) is preferably 150° C., and more preferably 180° C. The upper limit of the glass transition temperature (Tg) is preferably 320° C., and more preferably 300° C.

The polymer preferably further has a repeating unit represented by General Formula (2) below.

[Formula 2]

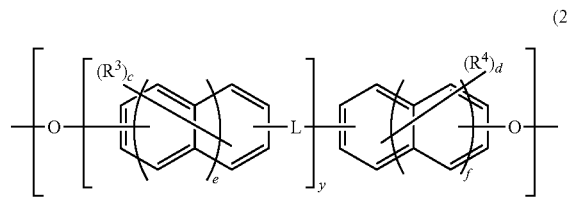

(2)

In Formula (2), $R^3$ and $R^4$ are each independently a halogen atom, a nitro group, a cyano group, or a monovalent organic group having from 1 to 20 carbon atoms, c and d are each independently an integer of 0 to 8, e, f, and y are each independently an integer from 0 to 2, and L is a single bond, —O—, —S—, —CO—, —SO—, —SO$_2$—, or a divalent organic group having from 1 to 20 carbon atoms.)

Examples of the halogen atoms represented by $R^3$ and $R^4$ include a fluorine atom, a chlorine atom, a bromine atom and an iodine atom.

Examples of the monovalent hydrocarbon group having from 1 to 20 carbons represented by $R^3$ and $R^4$ include a monovalent linear hydrocarbon group, a monovalent alicyclic hydrocarbon group, and a monovalent aromatic hydrocarbon group.

Examples of the monovalent linear hydrocarbon group include alkyl groups such as a methyl group, an ethyl group, a n-propyl group, an i-propyl group, a n-butyl group, an i-butyl group, a sec-butyl group, a t-butyl group, a n-pentyl group; alkenyl groups such as an ethenyl group, a propenyl group, a butenyl group, and a pentenyl group; and alkynyl groups such as an ethynyl group, a propynyl group, a butynyl group, and a pentynyl group.

Examples of the monovalent alicyclic hydrocarbon group include monocyclic cycloalkyl groups such as a cyclopropyl group, a cyclobutyl group, a cyclopentyl group, and a cyclohexyl group; polycyclic cycloalkyl groups such as a norbornyl group and an adamantyl group; monocyclic cycloalkenyl groups such as a cyclopropenyl group, a cyclobutenyl group, a cyclopentenyl group, and a cyclohexenyl group; and polycyclic cycloalkenyl groups such as a norbornenyl group.

Examples of the monovalent aromatic hydrocarbon group include aryl groups such as a phenyl group, a tolyl group, a xylyl group, a naphthyl group, and an anthryl group; and aralkyl groups such as a benzyl group, a phenethyl group, a phenylpropyl group, and a naphthylmethyl group.

Examples of the monovalent halogenated hydrocarbon group having 1 to 20 carbon atoms represented by $R^3$ and $R^4$ include groups in which part or all of the hydrogen atoms of the monovalent hydrocarbon group having from 1 to 20 carbon atoms exemplified as the group represented by $R^3$ and $R^4$ is substituted with a halogen atom such as a fluorine atom, a chlorine atom, a bromine atom, or an iodine atom.

Examples of the divalent organic group having from 1 to 20 carbon atoms represented by L include divalent linear hydrocarbon groups having from 1 to 20 carbon atoms, divalent fluorinated linear hydrocarbon groups having from 1 to 20 carbon atoms, divalent aromatic hydrocarbon groups having from 6 to 20 carbon atoms, and divalent fluorinated aromatic hydrocarbon groups having from 6 to 20 carbon atoms.

Examples of the divalent linear hydrocarbon group include a methylene group, an ethylene group, an n-propylene group, an isopropylene group, an n-butylene group, a sec-butylene group, a t-butylene group, a neopentylene group, a 4-methyl-pentane-2,2-diyl group, and a nonane-1, 9-diyl group Examples of the divalent alicyclic hydrocarbon group include monocyclic cycloalkyl groups such as a cyclopropyl group, a cyclobutyl group, a cyclopentyl group, and a cyclohexyl group; polycyclic cycloalkyl groups such as a norbornyl group and an adamantyl group; monocyclic cycloalkenyl groups such as a cyclopropenyl group, a cyclobutenyl group, a cyclopentenyl group, and a cyclohexenyl group; and polycyclic cycloalkenyl groups such as a norbornenyl group.

Examples of the divalent aromatic hydrocarbon group include aryl groups such as a phenyl group, a tolyl group, a xylyl group, a naphthyl group, and an anthryl group; and aralkyl groups such as a benzyl group, a phenethyl group, a phenylpropyl group, and a naphthylmethyl group.

Examples of these polymers include the polymers described in JP 2015-209511 A, WO 2016/143447, JP 2017-197725 A, and JP 2018-024827 A.

The content ratio of the polymer in the resin layer composition is preferably 10 parts by mass or greater and 90 parts by mass or less with respect to a total of 100 parts by mass of the below-described curable compound and polymer.

<Curable Compound>

The curable compound is a compound that is cured by irradiation with heat or light (for example, visible light, ultraviolet light, near infrared radiation, far infrared radiation, electron beam, or the like), and may require a curing aid to be described later. Examples of such a curable compound include epoxy compounds, cyanate ester compounds, vinyl compounds, silicone compounds, oxazine compounds, maleimide compounds, allyl compounds, acrylic compounds, methacryl compounds, and urethane compounds. These may be used alone or in combination of two or more of them. Among these, from the viewpoint of compatibility with the polymer and properties such as heat resistance, at least one of an epoxy compound, a cyanate ester compound, a vinyl compound, a silicone compound, an oxazine compound, a maleimide compound, and an allyl compound is preferable, and at least one of an epoxy compound, a cyanate ester compound, a vinyl compound, an allyl compound, and a silicone compound is more preferable.

The content ratio of the curable compound in the resin layer composition is preferably 10 parts by mass or greater and 90 parts by mass or less, and more preferably 20 parts by mass or greater and 80 parts by mass or less with respect to 100 parts by mass of the resin layer composition.

<Curing Aid>

Examples of curing aids include polymerization initiators such as a photoreaction initiator (a photoradical generator, a photoacid generator, and a photobase generator). Specific examples of the curing aid include onium salt compounds, sulfone compounds, sulfonate compounds, sulfonimide compounds, disulfonyldiazomethane compounds, disulfonylmethane compounds, oxime sulfonate compounds, hydrazine sulfonate compounds, triazine compounds, nitrobenzyl compounds, benzylimidazole compounds, organic halides, octyl acid metal salts, and disulfone. These curing aids may be used alone or in combination of two or more of them, regardless of the type.

The content ratio of the curing aid in the resin layer composition is preferably 5 parts by mass or greater and 20 parts by mass or less, more preferably 5 parts by mass or greater and 10 parts by mass or less with respect to 100 parts by mass of the resin layer composition.

<Solvent>

The resin layer composition may contain a solvent as necessary. Examples of the solvent include amide solvents such as N, N-dimethylacetamide, N, N-dimethylformamide, N-methyl-2-pyrrolidone, N-ethyl-2-pyrrolidone, 1,3-dimethyl-2-imidazolidinone; ester solvents such as γ-butyrolactone and butyl acetate; ketone solvents such as cyclopentanone, cyclohexanone, methyl ethyl ketone, and benzophenone; ether solvents such as 1,2-methoxyethane and diphenyl ether; polyfunctional solvents such as 1-methoxy-2-propanol and propylene glycol methyl ether acetate; sulfone solvents such as sulfolane, dimethyl sulfoxide, diethyl sulfoxide, dimethyl sulfone, diethyl sulfone, diisopropyl sulfone, and diphenyl sulfone; methylene chloride, benzene, toluene, xylene, dialkoxybenzene (carbon number of alkoxy group; from 1 to 4), and trialkoxybenzene (carbon number of alkoxy group; from 1 to 4). These solvents may be used alone or in combination of two or more of them.

When the resin layer composition contains a solvent, the amount is preferably 2000 parts by mass or less, more preferably 200 parts by mass or less with respect to 100 parts by mass of the resin layer composition excluding the solvent.

<Other Component>

The resin layer composition may contain other components as necessary. Examples of other components include antioxidants, strengthening agents, lubricants, flame retardants, antibacterial agents, coloring agents, release agents, foaming agents, and polymers other than the above polymers.

<Method for Preparing Resin Layer Composition>

The method for preparing the resin layer composition is not particularly limited. For example, it can be prepared by uniformly mixing a polymer, a curable compound, and other additives as necessary (for example, other components such as a curing aid, a solvent, and an antioxidant). In addition, the composition may be in the form of a liquid, a paste, or the like.

1.2. Metal Layer

The high-frequency circuit laminate according to the present embodiment includes a metal layer. The metal layer is preferably a metal foil or a sputtered film. The metal foil is preferably a copper foil. There are two types of copper foil, electrolytic foil and rolled foil, and either one may be used.

The surface roughness Ra of the metal layer is preferably from 10 to 300 nm, more preferably from 30 to 200 nm, and particularly preferably from 30 to 100 nm. When the surface roughness Ra of the metal layer is within the above range, the adhesion between the resin layer and the metal layer can be further improved when producing a high-frequency circuit laminate. Further, the in-plane thickness of the high-frequency circuit laminate can be made more uniform, and the peeling of the resin layer and the metal layer can be suppressed when the high-frequency circuit laminate is wound into a roll. Note that the surface roughness Ra of the metal layer refers to "arithmetic mean roughness" measured according to JIS B0601-2001.

The thickness of the metal layer is preferably from 3 to 50 μm, more preferably from 5 to 40 μm, and particularly preferably from 7 to 35 μm.

When a metal foil is used as the metal layer, a thinner one may be used as it is as long as the surface roughness Ra of the metal foil is within the above range, and the surface of the foil may be physically or chemically treated to control the surface roughness Ra within the above range. Methods for controlling the roughness of the surface of the metal foil include, but are not limited to, etching (such as acid treatment), laser treatment, electrolytic plating, electroless plating, sputtering, and sandblasting of the metal foil.

1.3. Method for Producing High-Frequency Circuit Laminate

The method for producing the high-frequency circuit laminate according to the present embodiment is not particularly limited as long as the resin layer and the metal layer can be laminated in contact with each other. "The resin layer and the metal layer are in contact with each other" is not limited to the case where one surface of the resin layer is in contact with the entire surface of the metal layer, and includes the case where at least a part of the one surface of the resin layer is in contact with the metal layer.

Preferred examples of producing the high-frequency circuit laminate according to the present embodiment will be described below.

Production Example A

FIGS. 1A to 1D are diagrams schematically showing cross sections in the steps of Production Example A. Production Example A will be described with reference to FIGS. 1A to 1D.

(Step A1)

As shown in FIG. 1A, a B-stage resin layer 12 is formed by applying a resin layer composition on a release layer 10, and a "B-stage resin layer/release layer laminate" (also referred to as a "B-stage sheet") is produced. As the release layer 10, a known film such as a PET film may be used. The PET film is not particularly limited, and may be, for example, Panaprotect MK38S available from PANAC Co., Ltd. The method for applying the resin layer composition may be a known application method. For example, it is preferable to apply the composition while adjusting the film thickness using a bar coater.

It is preferable to form the semi-cured B-stage resin layer 12 using a known heating means such as an oven after the resin layer composition is applied to the release layer 10 as described above. The heating temperature is preferably from 50 to 150° C., and more preferably from 70 to 130° C. When heating, the heating may be performed in two stages, such as from 50 to 100° C. and from 100 to 150° C. In addition, the total heating time is preferably less than 30 minutes, and more preferably less than 20 minutes. By heating under the conditions of temperature and time in the above ranges, the B-stage resin layer 12 having high film thickness uniformity can be produced. In addition, by suppressing the deterioration of the release layer 10, the release layer 10 can be satisfactorily peeled in the production process.

The surface roughness Ra of the B-stage resin layer 12 exposed on the surface is preferably from 1 to 100 nm, and more preferably from 10 to 50 nm. When the surface roughness Ra of the B-stage resin layer 12 is within the above range, the adhesion between the resin layer and the metal layer or between the resin layers can be further improved when producing a high-frequency circuit laminate. Note that the surface roughness Ra of the B-stage resin layer in the present invention refers to "arithmetic mean roughness" measured according to JIS B0601-2001.

The elastic modulus of the B-stage resin layer 12 is preferably such that the maximum value of the elastic modulus (MPa) is 1 MPa or greater, and more preferably 3 MPa or greater at 50° C. or higher and lower than 80° C. under the measurement condition of 1 Hz. In addition, the minimum value of the elastic modulus (MPa) in the temperature range of 80° C. or higher and 200° C. or lower is preferably 20 MPa or less, and more preferably 15 MPa or less. When the elastic modulus of the B-stage resin layer is in each temperature range, when the high-frequency circuit laminate is produced by hot pressing, the unevenness of the wiring portion and the non-wiring portion can be suppressed, whereby the transmission loss can be suppressed.

(Step A2)

Figure 1B:
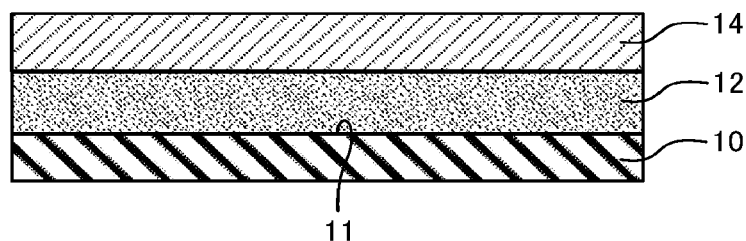
FIG. 1B is a cross-sectional view schematically illustrating a step A2 in Production Example A of the high-frequency circuit laminate.

As illustrated in FIG. 1B, the exposed resin layer surface 13 of the "B-stage resin layer/release layer laminate" produced in the step A1 is bonded to the metal layer 14 to produce a "metal layer/B-stage resin layer/release layer laminate". The surface roughness Ra of the metal layer 14 bonded to the resin layer surface 13 is preferably from 10 to 300 nm, more preferably from 30 to 200 nm, and particularly preferably from 30 to 100 nm.

When bonding, the resin layer surface 13 of the "B-stage resin layer/release layer laminate" and the metal layer 14 are overlaid, and then preferably thermocompressed using a heated roll (also referred to as a "hot roll" in the present specification) or the like. The linear load at the time of thermocompression bonding is preferably from 1 to 19 kN/m, and more preferably from 5 to 18 kN/m. The temperature of the thermocompression bonding is preferably from 50 to 200° C., more preferably from 50 to 150° C., and particularly preferably from 70 to 130° C.

Further, in the step A2, the "metal layer/B-stage resin layer/release layer laminate" immediately after bonding may be further subjected to annealing treatment by subsequently contacting the laminate with a heated roll or passing it through a heating furnace. The annealing treatment may be performed at a temperature equal to or higher than the melting point of the resin, and is preferably, for example, from 100 to 250° C., and more preferably from 110 to 230° C. The heating time is not particularly limited, but is preferably from 5 to 600 seconds, and more preferably from 10 to 300 seconds. By performing annealing treatment in a short period of time of, for example, about 5 to 600 seconds using a hot roll, a B-stage resin layer having high film thickness uniformity can be produced. In addition, by suppressing deterioration of the release layer, the release layer can be peeled off satisfactorily in the production process. Note that the above-described "the "metal layer/B-stage resin layer/release layer laminate" immediately after bonding" is further treated" refers to the step in which the laminate, which had been bonded in the production line for bonding the laminate, is further treated in-line after the bonding treatment, without taking out the bonded laminate from the production line.

(Step A3)

Figure 1C:
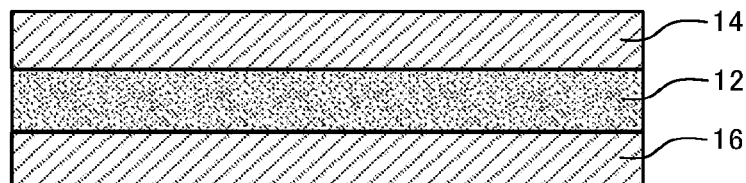
FIG. 1C is a cross-sectional view schematically illustrating a step A3 in Production Example A of the high-frequency circuit laminate.

As shown in FIG. 1C, the release layer 10 is peeled off from the "metal layer/B-stage resin layer/release layer laminate" produced in the step A2, and the exposed resin layer surface 11 and the metal foil 16 are bonded as necessary. When the release layer 10 is peeled off from the "metal layer/B-stage resin layer/release layer laminate" and the exposed B-stage resin layer surface 11 is bonded to the metal layer 16, it is preferable that the exposed resin layer surface 11 and the metal layer 16 are overlaid, and further subjected to thermocompression bonding using a hot roll or the like. The thermocompression bonding is preferably performed under the same conditions as in the step A2.

The surface roughness Ra of the resin layer surface 11 exposed by peeling the release layer 10 from the "metal layer/B-stage resin layer/release layer laminate" is preferably from 1 to 100 nm, and more preferably from 10 to 50 nm. When the surface roughness Ra of the B-stage resin layer is within the above range, when producing a high-frequency circuit laminate, the adhesion between the resin layer and the metal layer or between the resin layers can be further improved.

(Step A4)

Figure 1D:
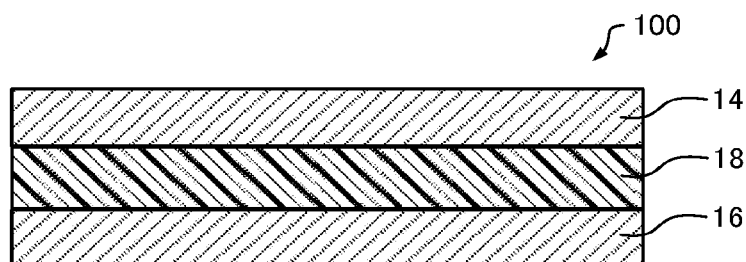
FIG. 1D is a cross-sectional view schematically illustrating a step A4 in Production Example A of the high-frequency circuit laminate.
Figure 2A:
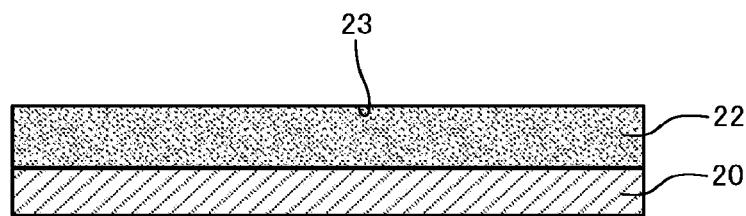
FIG. 2A is a cross-sectional view schematically illustrating a step B1 in Production Example B of the high-frequency circuit laminate.
Figure 2B:
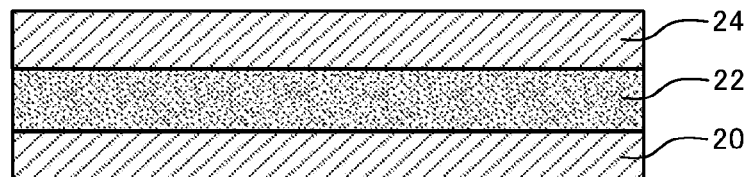
FIG. 2B is a cross-sectional view schematically illustrating a step B2 in Production Example B of the high-frequency circuit laminate.
Figure 2C:
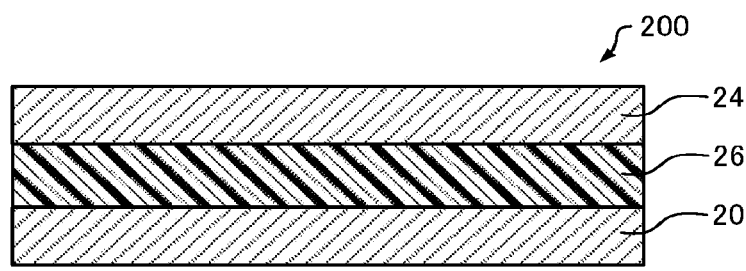
FIG. 2C is a cross-sectional view schematically illustrating a step B3 in Production Example B of the high-frequency circuit laminate.

As illustrated in FIG. 1D, the B-stage resin layer 12 is cured to form a C-stage resin layer 18, thereby obtaining a high-frequency circuit laminate 100. In order to cure the B-stage resin layer 12, the laminate obtained in the step A3 is preferably heated to 50 to 200° C., and more preferably to 100 to 200° C. using a known heating means such as an oven. When heating, the heating may be performed in two stages such as from 50 to 100° C. and from 100 to 200° C. In addition, the heating time is preferably less than 5 hours, and more preferably less than 3 hours. By heating under the conditions of temperature and time in the above ranges, the B-stage resin layer can be cured to produce a C-stage resin layer with high thickness uniformity Production Example B FIGS. 2A to 2C are diagrams schematically illustrating the cross sections in the steps of Production Example B. Production Example B will be described with reference to FIGS. 2A to 2C.

(Step B1)

As illustrated in FIG. 2A, a resin layer composition is applied to the metal layer 20 to form a B-stage resin layer 22, thereby producing a "metal layer/B-stage resin layer laminate". The coating method of the resin layer composition may be a known coating method, but it is preferable to use a bar coater to adjust the film thickness of the coating.

After the resin layer composition is applied to the metal layer 20 as described above, it is preferable to form the semi-cured B-stage resin layer 22 using a known heating means such as an oven. The heating temperature is preferably from 50 to 150° C., and more preferably from 70 to 130° C. When heating, the heating may be performed in two stages, such as from 50 to 100° C. and from 100 to 150° C. In addition, the total heating time is preferably less than 30 minutes, and more preferably less than 20 minutes. By heating under the conditions of temperature and time in the above ranges, the B-stage resin layer 22 with high film thickness uniformity can be produced.

(Step B2)

As illustrated in FIG. 2B, the metal layer 24 is bonded to the exposed resin layer surface 23 of the "metal layer/B-stage resin layer laminate" produced in the step B1, thereby producing a "metal layer/B-stage resin layer/metal layer laminate". When the metal layer 24 is bonded to the exposed resin layer surface 23, it is preferable that the exposed resin layer surface 23 and the metal layer 24 are overlaid, and then thermocompressed using a hot roll or the like. In addition, the thermocompression bonding is preferably performed under the same conditions as in the step A2.

Further, in the step B2, an annealing process may be performed by continuing the "metal layer/B-stage resin layer/metal layer" immediately after the bonding by contacting the heated roller or passing it through the heating furnace. The annealing treatment is preferably performed under the same conditions as in the step A2.

The surface roughness Ra of the exposed resin layer surface 23 is preferably from 1 to 100 nm, and more preferably from 10 to 50 nm. When the surface roughness Ra of the B-stage resin layer is within the above-described range, the adhesion between the resin layer and the metal layer can be further improved when producing a high-frequency circuit laminate. Furthermore, the surface roughness Ra of the metal layer 24 to be bonded to the resin layer surface 23 is preferably from 10 to 300 nm, more preferably from 30 to 200 nm, and particularly preferably from 30 to 100 nm.

(Step B3)

As illustrated in FIG. 3C, a high-frequency circuit laminate 200 is obtained by curing the B-stage resin layer 22 to form a C-stage resin layer 26. In the step B3, the "metal layer/B-stage resin layer/metal layer laminate" produced in the step B2 is preferably heated to 50 to 200° C., and more preferably heated to 100 to 200° C. using a known heating means such as an oven. When heating, the heating may be performed in two stages, such as from 50 to 100° C. and from 100 to 200° C. In addition, the heating time is preferably less than 5 hours, and more preferably less than 3 hours. By heating under the conditions of temperature and time in the above-described ranges, the B-stage resin layer 22 can be cured to produce the C-stage resin layer 26 with high film thickness uniformity.

2. LAMINATE ROLL

In the laminate roll according to the present embodiment, a high-frequency circuit laminate, which includes a structure in which a resin layer having a dielectric loss tangent of 0.001 to 0.01 at a frequency of 10 GHz at 23° C. and a metal layer are laminated in contact with each other, is wound around a core having a radius of 10 to 100 mm.

The laminate roll according to the present embodiment will be described below with reference to the drawings.

Figure 3:
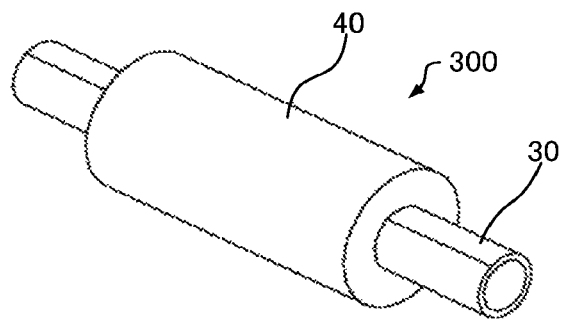
FIG. 3 is a perspective view illustrating an example of the laminate roll according to the present embodiment.
Figure 4:
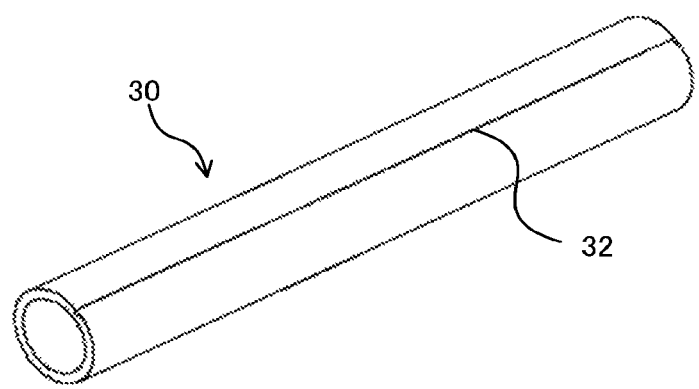
FIG. 4 is a perspective view illustrating an example of a core.

FIG. 3 is a perspective view illustrating an example of the laminate roll according to the present embodiment. FIG. 4 is a perspective view illustrating an example of the core usable in the present embodiment. As illustrated in FIG. 3, a laminate roll 300 according to the present embodiment includes a core 30 and a high-frequency circuit laminate 40 wound around the core 30. Such a high-frequency circuit laminate is generally formed into a long sheet having a certain width in order to perform processing efficiently, and used or stored in a state of a laminate roll wound around a core.

The laminate roll according to the present embodiment preferably uses a substantially cylindrical core. In this case, by reducing the radius of the cylindrical core and minimizing the radius of curvature as much as possible, even in a roll in which the same length of the high-frequency circuit laminate is wound, and productivity can be improved. However, in a laminate roll having a small radius of curvature, curling tends to remain in the high-frequency circuit laminate, and processing of the high-frequency circuit laminate tends to be difficult. For this reason, in order to suppress curling remaining in the high-frequency circuit laminate, it has been difficult to reduce the radius of curvature of the laminate roll.

In addition, in a known high-frequency circuit laminate, an adhesive layer is interposed in order to improve the adhesion between the resin layer and the metal layer. As a result, when storing a known laminate roll obtained by winding a high-frequency circuit laminate around a core, the adhesive layer is deteriorated and hardened due to external factors, and curling tends to occur when pulled out.

However, the laminate roll according to the present embodiment uses a high-frequency circuit laminate including a structure in which a resin layer having a dielectric loss tangent from 0.001 to 0.01 at a frequency of 10 GHz at 23° C. and a metal layer are in contact with each other, and thus allows the production of a small roll of a high-frequency circuit laminate that is wound around a core with a radius from 10 to 100 mm.

The core 30 and the high-frequency circuit laminate 40 may or may not be joined using a joining member. For example, as illustrated in FIG. 4, when the core 30 has a step 32, the end of the high-frequency circuit laminate 40 is joined to the step 32 of the core 30 via a joining member, and then the core 30 is rotated to wind up the high-frequency circuit laminate 40, thereby producing the laminate roll 300. Note that the core having the step may be, for example, the core described in Japanese Utility Model Registration No. 3147706.

Note that the type of joining member is not particularly limited, and various types of joining members can be used, such as adhesives, adhesives, and double-sided tapes. These may be used alone or in combination of two or more of them. In addition, this joining member may join the entire or a part of the total length of the high-frequency circuit laminate 40 in the width direction to the core 30.

Figure 5:
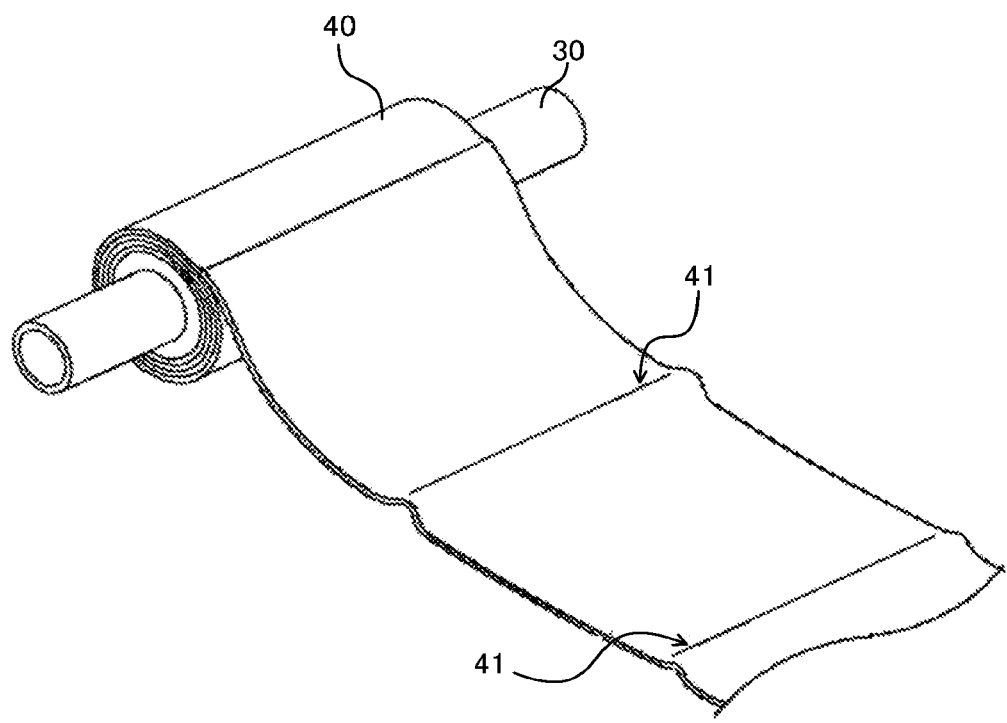
FIG. 5 is a perspective view illustrating a state of an impression generated when a laminate is unwound from a known laminate roll.

The radius of the core 30 is from 10 to 100 mm, but is preferably from 10 to 50 mm, and more preferably from 15 to 40 mm. When the radius of the core 30 is within the above-described range, formation of the impression 41 as illustrated in FIG. 5, which is caused by a step at a joint (winding start portion) between the high-frequency circuit laminate 40 and the core 30, can be effectively suppressed when the high-frequency circuit laminate 40 is pulled out from the laminate roll 300 and is processed. Note that the impression 41 can be a main factor of a decrease in the yield when processing the high-frequency circuit laminate, and thus is a kind of curling to be suppressed as much as possible in order to improve the productivity.

The height of the step 32 is preferably from 50 to 200 μm, more preferably from 60 to 180 μm, and particularly preferably from 70 to 150 μm. Additionally, the height of the step 32 is particularly preferably the thickness of the high-frequency circuit laminate 20 (μm)±10 μm. When the height of the step 32 is within the above-described range, the step at the joint between the step 32 of the core 30 and the high-frequency circuit laminate 40 is eliminated, whereby formation of an impression in the laminate roll 300 is more effectively suppressed.

The material of the core 30 is not particularly limited, and examples thereof include paper, metal, and a thermoplastic resin. When the material of the core 30 is paper, the surface may be coated with a resin or the like. Examples of the metal include SUS, iron, and aluminum. Examples of thermoplastic resins include olefin resins (for example, polyethylene and polypropylene), styrene resins (for example, ABS resin, AES resin, AS resin, MBS resin, and polystyrene), polyvinyl chloride, vinylidene chloride resin, methacrylic resins, polyvinyl alcohol, styrene block copolymer resins, polyamide, polyacetal, polycarbonate, modified polyphenylene ether, polyesters (for example, polybutylene terephthalate, and polyethylene terephthalate), fluororesins, polyphenylene sulfide, polysulfone, amorphous polyarylate, polyetherimide, polyether sulfone, polyether ketones, liquid crystal polymers, polyamide imides, thermoplastic polyimides, and syndio polystyrene. These may be used alone or in combination of two or more of them. When the material of the core 30 is a thermoplastic resin, the core 30 and the step 32 thereof may be produced by extrusion or cutting.

The method for winding the bonded high-frequency circuit laminate into a roll is not particularly limited, and may be in accordance with a method used in the production of a high-frequency circuit laminate or film.

3. CIRCUIT BOARD (FLEXIBLE PRINTED CIRCUIT BOARD)

A circuit board such as FPC can be manufactured using the high-frequency circuit laminate of the present invention described above. In such a circuit board, the transmission loss can be reduced even when driven at a high frequency by using the high-frequency circuit laminate of the present invention as at least a part of the laminate structure. Such a circuit board is required to include the high-frequency circuit laminate of the present invention as a part of a laminated structure, and can be produced by applying the production process described in, for example, WO 2012/014339 and JP 2009-231770 A.

A circuit board can be produced by, for example, laminating the high-frequency circuit laminate of the present invention, patterning the metal layer of the high-frequency circuit laminate of the present invention by etching, drilling it, or cutting it to a required size.

In such a circuit board, since no adhesive layer is interposed, the resin layer covering the metal wiring layer, which is a convex portion, does not have a large step, and the surface of the resin layer is smooth. For this reason, even if circuits are laminated, high positioning accuracy can be satisfied, and more layers of circuits can be integrated.

The circuit board can be produced by, for example:
step (a): a step of laminating a resin film on a circuit board to form a resin layer;
step (b): a step of flattening the resin layer by heating and pressing; and
step (c): a step of further forming a circuit layer on the resin layer.

The method for laminating the resin film on the circuit board in the step (a) is not particularly limited, and examples thereof include lamination methods using a multi-stage press, a vacuum press, a normal pressure laminator, or a laminator that heats and presses under vacuum. Among them, the method using a laminator that heats and presses under vacuum is preferable. As a result, even if the circuit board has a fine wiring circuit on the surface, there is no void and the space between the circuits can be embedded with the resin. The lamination conditions are not particularly limited, but the compression temperature is from 70 to 130° C., the compression pressure is from 1 to 11 kgf/cm$^2$, and the lamination is preferably performed under reduced pressure or vacuum. The lamination may be performed by a batch system or a continuous system using rolls.

The circuit substrate is not particularly limited, and may be, for example, a glass epoxy substrate, a metal substrate, a polyester substrate, a polyimide substrate, a BT resin substrate, a thermosetting polyphenylene ether substrate, or a fluororesin substrate. The circuit surface of the surface on which the resin film of the circuit board is laminated may be pre-roughened. Further, the number of circuit layers of the circuit board is not limited. For example, when producing a printed wiring board for a millimeter-wave radar, the number of circuit layers may be freely selected from 2 to 20 according to the design.

In the step (b), the resin film and the circuit board laminated in the step (a) are heated and pressed to flatten. The conditions are not particularly limited, but the temperature is preferably from 100° C. to 250° C., the pressure is preferably from 0.2 to 10 MPa, and the time is preferably from 30 to 120 minutes, and the temperature is more preferably from 150° C. to 220° C.

In the step (c), a circuit layer is further formed on the resin layer formed by heating and pressing the resin film and the circuit board. The method for forming the circuit layer formed on the resin layer as described above is not particularly limited. The circuit layer may be formed by, for example, an etching method such as a subtractive method, or a semi-additive method.

The subtractive method is a method for forming a desired circuit, including forming an etching resist layer having a shape corresponding to a desired pattern shape on a metal layer, and dissolving and removing the metal layer in a portion, where the resist has been removed, with a chemical solution by a subsequent development process.

The semi-additive method is a method for forming a desired circuit layer, including forming a metal film on the surface of the resin layer by electroless plating, forming a plating resist layer having a shape corresponding to a desired pattern on the metal film, and then forming a metal layer by electrolytic plating, followed by removing unnecessary electroless plating layer with a chemical solution or the like.

Additionally, holes such as via holes may be formed in the resin layer as needed. The method for forming the holes is not limited, and may use, for example, an NC drill, a carbon dioxide laser, a UV laser, a YAG laser, or plasma.

4. EXAMPLES

The present invention will be described in detail below based on examples, but the present invention is not limited to these examples. The "parts" and "%" in the examples and comparative examples are based on mass unless otherwise specified.

4.1. Synthesis of Polymer

Synthesis Example 1

In a four-neck separable flask equipped with a stirrer, 1,1-bis (4-hydroxyphenyl)-3,3,5-trimethylcyclohexane (BisTMC) (18.6 g, 60.0 mmol), 4,6-dichloropyrimidine (Pym) (8.9 g, 60.0 mmol), and potassium carbonate (11.1 g, 81.0 mmol) were weighed, N-methyl-2-pyrrolidone (64 g) was added, and the reaction was carried out at 130° C. for 6 hours in a nitrogen atmosphere. After completion of the reaction, N-methyl-2-pyrrolidone (368 g) was added, salts were removed by filtration, and then the solution was poured into methanol (9.1 kg). The precipitated solid was separated by filtration, washed with a small amount of methanol, recovered by filtration again, and then dried under reduced pressure at 120° C. for 12 hours using a vacuum dryer, thereby obtaining a polymer P-1 having a structural unit represented by the following formula (P-1) (recovery amount; 20.5 g, yield; 90%, weight average molecular weight (Mw); 32000, glass transition temperature) (Tg); 206° C.).

[Chemical Formula 3]

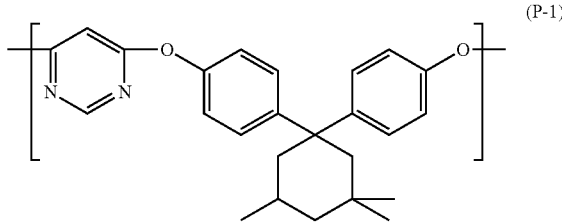

(P-1)

Note that the glass transition temperature (Tg) was measured using a dynamic viscoelasticity measuring device ("DMS7100" available from Seiko Instruments Inc.) at a frequency of 1 Hz and a temperature rising rate of 10° C./minute, and used the temperature at which the loss tangent was at a maximum. The loss tangent was a value obtained by dividing the storage elastic modulus by the loss elastic modulus.

In addition, the weight average molecular weight (Mw) was measured under the following conditions using a GPC apparatus ("HLC-8320" available from Tosoh Corporation).
Column: the one connecting "TSK gel α-M" available from Tosoh Corporation and "TSK gel guard column α" available from Tosoh Corporation
Developing solvent: N-methyl-2-pyrrolidone
Column temperature: 40° C.
Flow rate: 1.0 mL/min
Sample concentration: 0.75% by mass
Sample injection volume: 50 μL
Detector: differential refractometer
Standard substance: monodisperse polystyrene Synthesis Example 2

In a four-neck separable flask equipped with a stirrer, 1,1-bis(4-hydroxyphenyl)-3,3,5-trimethylcyclohexane (BisTMC) (10.7 g, 34.5 mmol), 3,6-dichloropyridazine (Pyd) (5.1 g, 34.2 mmol) and potassium carbonate (6.5 g, 47.0 mmol) were weighed, N-methyl-2-pyrrolidone (36 g) was added, and the reaction was carried out at 145° C. for 9 hours in a nitrogen atmosphere. After completion of the reaction, N-methyl-2-pyrrolidone (150 g) was added for dilution, and after removing salts by filtration, the solution was poured into methanol (3 kg). The precipitated solid was separated by filtration, washed with a small amount of methanol, recovered by filtration again, and then dried under the same conditions as in Synthesis Example 1, thereby obtaining a polymer P-2 having a structural unit represented by Formula (P-2) below (recovery amount 7.6 g, yield 48%, weight average molecular weight (Mw); 30000, glass transition temperature) (Tg); 232° C.). Note that the weight average molecular weight and glass transition temperature were measured in the same manner as in Synthesis Example 1.

[Chemical Formula 4]

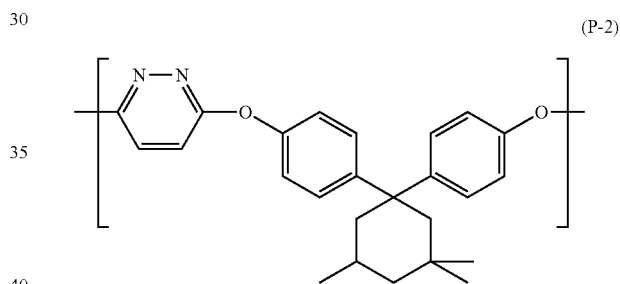

(P-2)

Synthesis Example 3

In a four-neck separable flask equipped with a stirrer, 1,1-bis(4-hydroxyphenyl)-3,3,5-trimethylcyclohexane (BisTMC) (18.6 g, 60.0 mmol), 4,6-dichloro-2-phenylpyrimidine (PhPym) (13.7 g, 61.1 mmol), and potassium carbonate (11.4 g, 82.5 mmol) were weighed, N-methyl-2-pyrrolidone (75 g) was added, and the reaction was carried out at 130° C. for 6 hours in a nitrogen atmosphere. After completion of the reaction, N-methyl-2-pyrrolidone (368 g) was added for dilution, salts were removed by filtration, and then the solution was poured into methanol (9.1 kg). The precipitated solid was separated by filtration, washed with a small amount of methanol, recovered by filtration again, and then dried under the same conditions as in Synthesis Example 1, thereby obtaining a polymer P-3 having a structural unit represented by Formula (P-3) below (recovery amount 20.5 g, yield 90%, weight average molecular weight (Mw); 187000, glass transition temperature) (Tg); 223° C.). Note that the weight average molecular weight and the glass transition temperature were measured in the same manner as in Synthesis Example 1.

[Chemical Formula 5]

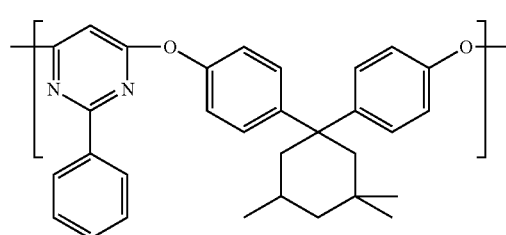

(P-3)

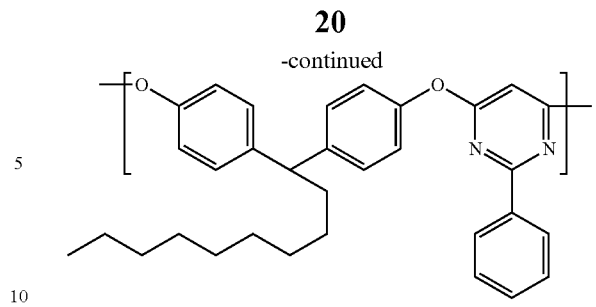

Synthesis Example 4

In a four-neck separable flask equipped with a stirrer, 1,1-bis (4-hydroxyphenyl)-3,3,5-trimethylcyclohexane (BisTMC) (12.4 g, 40.0 mmol), 2,2-bis(4-hydroxyphenyl)-propane (BisA) (2.3 g, 10.0 mmol), 1,1-bis (4-hydroxyphenyl)-nonane (BisP-DED) (3.3 g, 10.0 mmol), 4,6-dichloro-2-phenylpyrimidine (PhPym) (13.7 g, 61.1 mmol), and potassium carbonate (11.4 g, 82.5 mmol) were weighed, N-methyl-2-pyrrolidone (75 g) was added, and the reaction was carried out at 130° C. for 6 hours in a nitrogen atmosphere. After completion of the reaction, N-methyl-2-pyrrolidone (368 g) was added for dilution, salts were removed by filtration, and then the solution was poured into methanol (9.1 kg). The precipitated solid was separated by filtration, washed with a small amount of methanol, recovered by filtration again, and then dried under the same conditions as in Synthesis Example 1, thereby obtaining a polymer P-4 having a structural unit represented by the following formula (P-4) (recovery amount 23.5 g, yield 87%, weight average molecular weight (Mw); 165000, glass transition temperature) (Tg); 196° C.). Note that the weight average molecular weight and the glass transition temperature were measured in the same manner as in Synthesis Example 1.

[Chemical Formula 6]

Synthesis Example 5

In a four-neck separable flask equipped with a stirrer, 1,1-bis(4-hydroxyphenyl)-3,3,5-trimethylcyclohexane (BisTMC) (12.4 g, 40.0 mmol), 4,4'-(1,3-dimethylbutyl-idene) bisphenol (BisP-MIBK) (2.7 g, 10.0 mmol), 1,1-bis (4-hydroxyphenyl)-nonane (BisP-DED) (3.3 g, 10.0 mmol) 2.0 mmol), 4,6-dichloro-2-phenylpyrimidine (PhPym) (13.7 g, 61.1 mmol), and potassium carbonate (11.4 g, 82.5 mmol) were weighed, N-methyl-2-pyrrolidone (75 g) was added, and the reaction was carried out at 130° C. for 6 hours in a nitrogen atmosphere. After completion of the reaction, N-methyl-2-pyrrolidone (368 g) was added for dilution, salts were removed by filtration, and then the solution was poured into methanol (9.1 kg). The precipitated solid was separated by filtration, washed with a small amount of methanol, recovered by filtration again, and then dried under the same conditions as in Synthesis Example 1, thereby obtaining a polymer P-5 having a structural unit represented by Formula (P-5) below (recovery amount 23.8 g, yield 88%, weight average molecular weight (Mw); 157000, glass transition temperature) (Tg); 190° C.). Note that the weight average molecular weight and glass transition temperature were measured in the same manner as in Synthesis Example 1.

[Chemical Formula 7]

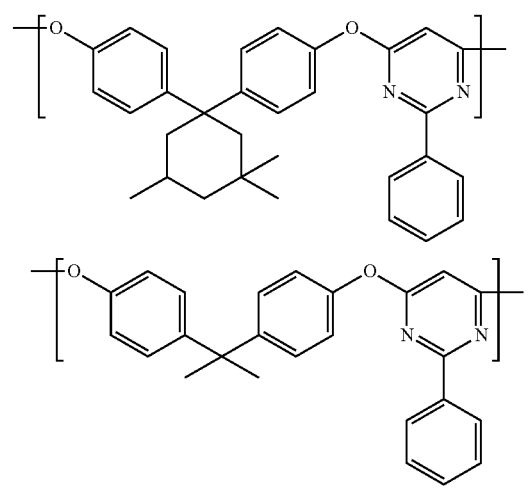

(P-4)

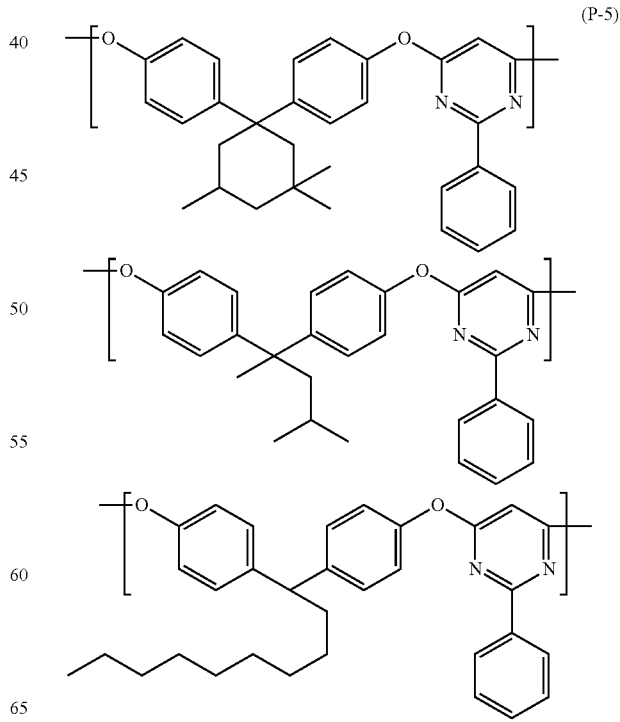

(P-5)

4.2. Example 1

4.2.1.B Production of Stage Resin Layer/Release Layer Laminate 50 parts of polymer P-1, 50 parts of 2,2'-bis (4-cyanatophenyl)propane (available from Tokyo Chemical Industry Co., Ltd.) as a curable compound, and 5 parts of 1-benzyl-2-methylimidazole as a curing aid (product name "BMI 12" available from Mitsubishi Chemical Corporation), and 160 parts of cyclopentanone were mixed to prepare a resin layer composition.

As a release layer, the resin layer composition prepared above was coated on a 100 μm thick PET film (Teijin Tetron Film G2 available from Teijin Film Solutions Co., Ltd.) with a bar coater so that the film thickness after curing was 25 μm, and heated at 70° C. for 10 minutes using an oven. Thereafter, the coating was heated at 130° C. for 10 minutes, thereby obtaining a "B-stage resin layer/release layer laminate" in which the B-stage resin layer was laminated on the PET film.

<Surface Roughness Ra>

The surface of the resin layer of the "B-stage resin layer/release layer laminate" obtained above was measured using a white interference microscope (New View 5032 available from ZYGO Corporation), and "arithmetic average roughness" calculated for the 10 μm×10 μm range in accordance with JIS B0601-2001 was used as the surface roughness Ra. The results are shown in Table 1.

<Measurement of Elastic Modulus of Resin Layer at 50° C. to 200° C.>

The release layer (PET film) was peeled off from the "B-stage resin layer/release layer laminate" obtained above, a test piece (width 3 mm×length 2 cm) was cut out, and the maximum value of the elastic modulus (MPa) in the temperature range of 50° C. or higher and lower than 80° C. and the minimum value of the elastic modulus (MPa) in the temperature range of 80° C. or higher and 200° C. or lower was measured using a DMS tester (available from Seiko Instruments Inc.) under the measurement condition of 1 Hz and 10° C./min. The results are shown in Table 1.

4.2.2. Production of Metal Layer/B-Stage Resin Layer/Release Layer Laminate A 18 μm thick copper foil (model number "TQ-M4-VSP", surface roughness 110 nm, available from Mitsui Mining & Smelting Co., Ltd.) was overlaid on the exposed resin layer of the "B-stage resin layer/release layer laminate" obtained above, further the laminate was pressed with a hot roll at 150° C. under a linear load of 10 kN/m, thereby producing a "metal layer/B-stage resin layer/release layer laminate" having a laminate structure of copper foil/B-stage resin layer/PET film. Note that the surface roughness Ra of the copper foil was measured using a white interference microscope (New View 5032 available from ZYGO), and the "arithmetic mean roughness" calculated for the 10 μm×10 μm range was defined as the surface roughness Ra in accordance with JIS B0601-2001. The results are shown in Table 1.

<Surface Roughness after Release Layer Release Ra>

The release layer (PET film) was peeled off from the "metal layer/B-stage resin layer/release layer laminate" obtained above, and the surface of the exposed resin layer was measured using a white interference microscope (New View 5032 available from ZYGO Corporation), and the "arithmetic mean roughness" calculated for a range of 10 μm×10 μm in accordance with JIS B0601-2001 was used as the surface roughness Ra. The results are shown in Table 1.

4.2.3. Production and Evaluation of High-Frequency Circuit Laminate

The release layer (PET film) was peeled off from the "metal layer/B-stage resin layer/release layer laminate" obtained above, and the exposed resin layer surface and an 18 μm thick copper foil (model number "TQ-M4-VSP", surface roughness 110 nm, available from Mitsui Mining & Smelting Co., Ltd.) were placed on top of each other, pressed with a hot roll at 150° C. under a linear load of 10 kN/m, and then heated at 250° C. for 3 hours using an oven, thereby producing a high-frequency circuit laminate having a laminated structure of "copper foil (film thickness: 18 μm)/C-stage resin layer (film thickness: 25 μm)/copper foil (film thickness: 18 μm)" in which copper foil was laminated on both sides of the C-stage resin layer. Note that the surface roughness Ra of the copper foil (metal layer) was measured using a white interference microscope (New View 5032, available from ZYGO Corporation), and the "arithmetic average roughness" calculated for a range of 10 μm×10 μm based on JIS B0601-2001 was defined as the surface roughness Ra. The results are shown in Table 1.

<Tensile Strength and Tensile Elongation>

The produced high-frequency circuit laminate was subjected to etching treatment to remove the copper foil, thereby producing a resin film for evaluation. A dumbbell-shaped test piece of JIS K 7161 7 was cut out from the prepared resin film, and pulled at 5 mm/min using "Ez-LX" available from Shimadzu Corporation, and the stress and elongation at break were measured as tensile strength and tensile elongation, respectively. The results are shown in Table 1.

<Glass Transition Temperature (Tg)>

The produced high-frequency circuit laminate was subjected to etching treatment to remove the copper foil, thereby producing a resin film for evaluation. A test piece (width 3 mm×length 1 cm) was cut out from the prepared resin film, and the glass transition temperature (Tg) was measured using a DMS tester (model number "EXSTAR4000", available from Seiko Instruments Inc.). The results are shown in Table 1.

<Elastic Modulus>

The produced high-frequency circuit laminate was subjected to etching treatment to remove the copper foil, thereby producing a resin film for evaluation. A dumbbell-shaped test piece of JIS K7161 7 was cut out from the prepared resin film, and a tensile test was performed at 5 mm/min in accordance with JIS K7161 using "Ez-LX" available from Shimadzu Corporation to measure the tensile modulus of elasticity. The results are shown in Table 1.

<Electrical Characteristics (Relative Permittivity and Dielectric Loss Tangent)>

The produced high-frequency circuit laminate was subjected to etching treatment to remove the copper foil, thereby producing a resin film for evaluation. A test piece (2.6 mm wide×80 mm long) was cut out from the produced resin film and measured for the relative permittivity and the dielectric loss tangent at 23° C. and 10 GHz using a dielectric constant measuring device by cavity perturbation method (model No. "PNA-L Network Analyzer N5230A" available from Agilent Technologies and a model number "Cavity Resonator CP 531 for 10 GHz" available from Kanto Electronic Application and Development Inc.). The results are shown in Table 1.

<Peel Strength>

A test piece (1 cm wide×10 cm long) was cut out from the produced high-frequency circuit laminate, and was pulled in the direction of 90° at 500 mm/min using "Instron 5567"

available from Instron, and the peel strength was measured in accordance with "TPC-TM-650 2.4.9". The results are shown in Table 1.

4.2.4. Preparation and Evaluation of Laminate Roll

The high-frequency circuit laminate body produced above was attached to a core made of cardboard having a width of 250 mm and a core radius of 40 mm, to which a 10 μm thick double-sided tape had been attached to the center in the width direction over a length of 100 mm. Next, after joining the produced high-frequency circuit laminate to the double-sided tape, the high-frequency circuit laminate was wound around the core in 1,000 layers with a winding tension of 150 N/m to produce a laminate roll.

The produced high-frequency circuit laminate wound into a laminate roll was stored at 25° C. for one month, and then the entire laminate was unwound from the core. Thereafter, curling in the unlaminate roll was visually evaluated. When no curling was observed, it was judged to be "good", and when the curling was so severe that it could not be put to practical use, it was judged as "poor". The results are shown in Table 1.

4.2.5. Fabrication and Evaluation of Circuit Board

One side of the high-frequency circuit laminate prepared above was patterned with a copper foil using a photosensitive dry film, and copper wiring patterns having a pitch of 150 μm and a line width of 40, 45, 50, 55 and 60 μm, and a pitch of 750 μm and a line width of 200, 220, 240, 260 and 280 μm were prepared. Next, on the surface of the prepared copper wiring pattern, the "B-stage resin layer/release layer laminate" prepared as described above was placed in such a manner that the B-stage resin layer side contacts the copper wiring of the patterned high-frequency circuit laminate, and then a panel board was placed thereon. After forming with heat and pressure under pressing conditions at 120° C./3.0 MPa/5 min, the release layer (PET film) was peeled off, followed by heating at 250° C. for 3 hours to produce a circuit board.

<Transmission Loss Evaluation>

The circuit board prepared above was measured for the transmission loss at a frequency of 20 GHz at 25° C. using a measurement probe (Single (ACP40GSG250), available from Cascade Microtech, Inc.) and a vector network analyzer (E8363B, available from Keysight technology). When the transmission loss was −5 dB/100 mm or greater, it was judged to be good.

<Evaluation of Substrate Step>

Both surfaces of the high-frequency circuit laminate prepared above were etched so that the thickness of the copper foil was 9 μm, further the copper foil was patterned using a photosensitive dry film to prepare a copper wiring pattern having a pitch of 100 μm and a line width of 50 μm.

Next, the release layer (PET film) was peeled off from the "metal layer/B-stage resin layer/release layer laminate" produced above, the laminate was arranged on both sides so that the peeled and exposed resin layer and the prepared copper wiring pattern were in contact with each other. Further, the object was sandwiched between end plates, heated and pressed under pressing conditions of 120° C./1.1 MPa/2 minutes, and further heated at 250° C. for 3 hours.

Thereafter, the copper foil was patterned using a photosensitive dry film, and a copper wiring pattern with a pitch of 100 μm and a line width of 50 μm was formed on both sides.

Finally, the release layer (PET film) was peeled off from the "B-stage resin layer/release layer laminate" produced above, the laminate was arranged on both sides so that the resin layer on the release surface and the prepared copper wiring pattern are in contact with each other. Further, the object was sandwiched between end plates, formed by heating and pressing under pressing conditions of 120° C./1.1 MPa/2 minutes, followed by further heating at 250° C. for 3 hours, thereby producing an evaluation substrate having four layers of copper wiring.

The cross-sectional shape of the produced substrate for evaluation was observed using a scanning electron microscope. When the difference between the recessed part and the convex part was 5% or less, the substrate was judged to be practical and good, and when the difference was greater than 5%, the substrate was judged to be impractical and defective. The results are shown in Table 1.

4.3. Examples 2 to 7, Comparative Examples 1 to 3, and Reference Example 1

A high-frequency circuit laminate was produced and evaluated in the same manner as in Example 1 except that the composition for the resin layer was changed to the composition shown in Table 1, and the type and various thickness of the metal film, the lamination conditions, and the production conditions for the laminate roll were changed as shown in Table 1. The results are shown in Table 1.

4.4. Example 8

The resin layer composition prepared in Example 1 was coated on a 18 μm thick copper foil (model number "TQ-M4-VSP", surface roughness 110 nm, available from Mitsui Mining & Smelting Co., Ltd.) with a bar coater so that the film thickness after curing was 25 μm, and heated at 70° C. for 10 minutes using an oven. Thereafter, the coating was heated at 130° C. for 10 minutes to produce a "metal layer/B-stage resin layer laminate" having a laminate structure of copper foil/B-stage resin layer.

An 18 μm thick copper foil (model number "TQ-M4-VSP", surface roughness 110 nm, available from Mitsui Kinzoku Co.) was overlaid on the exposed resin layer surface of the produced "metal layer/B-stage resin layer laminate", pressed with a hot roll at 150° C. under a linear load of 10 kN/m, and then heated at 250° C. for 3 hours using an oven to produce a high-frequency circuit laminate body having a laminate structure of copper foil (film thickness 18 μm)/C-stage resin layer (film thickness 25 μm)/copper foil (film thickness 18 μm) in which copper foils were laminated on both sides of the C-stage resin layer. The high-frequency circuit laminate produced in this manner was evaluated in the same manner as in Example 1. The results are shown in Table 1.

4.5. Comparative Example 4

The resin layer composition was prepared in the same manner as in Example 1 so as to have the composition shown in Table 1, coated on a 18 μm thick copper foil (model number "TQ-M4-VSP", surface roughness 110 nm, available from Mitsui Mining & Smelting Co., Ltd.) with a bar coater so that the film thickness after curing was 25 μm, and heated at 70° C. for 10 minutes using an oven. Thereafter, the coating was heated at 130° C. for 10 minutes, and further heated at 250° C. for 3 hours.

Thereafter, the exposed resin layer surface was subjected to copper sputtering, thereby producing a high-frequency circuit laminate having a laminate structure of copper foil (film thickness 18 μm)/resin layer (25 μm)/copper layer (1 μm) in which copper layers were laminated on both sides of the resin layer. The high-frequency circuit laminate produced in this manner was evaluated in the same manner as in Example 1. The results are shown in Table 1.

4.6. Comparative Example 5

A maleic acid-modified styrene-ethylenebutylene-styrene block copolymer (trade name "Kapton 100H", available from Toray Industries) was roll-coated on the surface of a 25 µm thick polyimide film (trade name "Tuffteck M1913", available from Asahi Kasei Chemicals Corporation) to form an adhesive layer. Next, the coated film was placed in an oven and dried at 100° C. for 3 minutes to form a coating (adhesive layer) having a thickness of 25 µm, thereby obtaining an "adhesive layer/polyimide layer laminate".

Thereafter, both surfaces of an 18 µm thick copper foil (model number "TQ-M4-VSP", surface roughness 110 nm, available from Mitsui Mining & Smelting Co., Ltd.) were placed on top of the produced "adhesive layer/polyimide layer laminate" so as to be in contact with the surface of the adhesive layer, pressed with a hot roll at 120° C. under a linear load of 10 kN/m, and then heated at 180° C. for 1 minute under a pressure of 3 MPa using an oven. Thereafter, the object was heated at 180° C. for 1 hour, thereby producing a high-frequency circuit laminate having a laminate structure "copper foil (18 µm thick)/polyimide layer (25 µm thick)/copper foil (18 µm thick)" in which copper foils were laminated on both sides of the polyimide layer. The high-frequency circuit laminate produced in this manner was evaluated in the same manner as in Example 1. The results are shown in Table 1.

4.7. Evaluation Results

Table 1 shows the composition of the resin layer composition used in each of the examples and comparative examples, and the evaluation results of each layer, the high-frequency circuit laminate, and the laminate roll.

TABLE 1

| | | | Example | | | | | | |
|---|---|---|---|---|---|---|---|---|---|
| | | | 1 | 2 | 3 | 4 | 5 | 6 | 7 |
| Resin layer composition | Polymer | Type | P-1 | P-1 | P-1 | P-2 | P-3 | P-4 | P-5 |
| | | Parts by mass | 50 | 35 | 80 | 50 | 50 | 50 | 50 |
| | Curable compound | Type | Compound A | Compound B | Compound C | Compound A | Compound A | Compound A | Compound A |
| | | Parts by mass | 50 | 65 | 20 | 50 | 50 | 50 | 50 |
| | | Type | — | — | — | — | — | — | — |
| | | Part by mass | — | — | — | — | — | — | — |
| | Curing aid | Type | Curing aid A | Curing aid A | Curing aid A | Curing aid A | Curing aid B | Curing aid A | Curing aid A |
| | | Part by mass | 5 | 2.5 | 5 | 5 | 0.2 | 5 | 5 |
| | Solvent | Type | Solvent A | Solvent B | Solvent A | Solvent A | Solvent A | Solvent A | Solvent A |
| | | Part by mass | 160 | 200 | 160 | 160 | 160 | 160 | 160 |
| Metal layer/B-stage resin layer (/release layer) laminate | B-stage resin layer | Surface roughness Ra (nm) | 35 | 29 | 42 | 32 | 34 | 34 | 34 |
| | | Surface roughness Ra (nm) after peeling of release layer | 20 | 18 | 21 | 19 | 20 | 22 | 21 |
| | | Maximum elastic modulus at 50° C. or higher and lower than 80° C. (MPa) | 6 | 4 | 10 | 6 | 6 | 5 | 6 |
| | | Minimum value of elastic modulus (MPa) at 80° C. or higher and 200° C. or lower | 0.5 | 0.08 | 15 | 0.5 | 0.5 | 0.3 | 0.5 |
| | Metal layer | Type | Electrolytic copper foil A | Electrolytic copper foil B | Electrolytic copper foil A | Rolled copper foil A | Electrolytic copper foil A | Electrolytic copper foil A | Electrolytic copper foil A |
| | | Surface roughness Ra (nm) | 110 | 150 | 110 | 35 | 110 | 110 | 110 |
| | | Thickness (µm) | 18 | 18 | 18 | 35 | 12 | 18 | 18 |
| High-frequency circuit laminate | C-stage resin layer | Thickness (µm) | 25 | 25 | 25 | 100 | 25 | 25 | 25 |
| | | Tensile strength (MPa) | 100 | 70 | 89 | 75 | 56 | 78 | 84 |
| | | Tensile elongation (%) | 4 | 11 | 3 | 3 | 10 | 38 | 28 |

TABLE 1-continued

| | | | | | | | | | |
|---|---|---|---|---|---|---|---|---|---|
| | | Tg (° C.) | 230 | 168 | 220 | 173 | 162 | 164 | 173 |
| | | Elastic modulus (GPa) | 1.8 | 0.3 | 2.4 | 1.8 | 1.8 | 1.4 | 1.7 |
| | | Relative permittivity | 2.6 | 3 | 2.9 | 2.6 | 2.6 | 2.8 | 2.8 |
| | | Dielectric loss tangent | 0.005 | 0.009 | 0.008 | 0.005 | 0.005 | 0.004 | 0.004 |
| | Metal layer | Type | Electrolytic copper foil A | Electrolytic copper foil B | Electrolytic copper foil A | Rolled copper foil A | Electrolytic copper foil A | Electrolytic copper foil A | Electrolytic copper foil A |
| | | Surface roughness Ra (nm) | 110 | 150 | 110 | 35 | 110 | 110 | 110 |
| | | Thickness (μm) | 18 | 18 | 18 | 35 | 12 | 18 | 18 |
| | Lamination condition | Heating temperature (° C.) | 150 | 150 | 190 | 160 | 110 | 180 | 170 |
| | | Load (kN/m) | 10 | 17 | 10 | 14 | 15 | 16 | 15 |
| | Laminate properties | Laminate thickness (μm) | 61 | 61 | 61 | 170 | 49 | 61 | 61 |
| | | Peel strength (N/cm) | 7 | 7.8 | 6 | 5.3 | 6.2 | 7.5 | 8.3 |
| | Circuit board evaluation | Transmission loss (dB/100 mm) | −4.6 | −4.9 | −4.9 | −4.2 | −4.5 | −4.2 | −4 |
| | | Substrate step | Good | Good | Good | Good | Good | Good | Good |
| Laminate roll | Core | Material | Paper | Paper | Paper | ABS | SUS | SUS | SUS |
| | | Radius (mm) | 40 | 100 | 30 | 40 | 80 | 50 | 50 |
| | | Laminate roll evaluation | Good | Good | Good | Good | Good | Good | Good |

| | | | Example | Comparative Example | | | | | Reference Example |
|---|---|---|---|---|---|---|---|---|---|
| | | | 8 | 1 | 2 | 3 | 4 | 5 | 1 |
| Resin layer composition | Polymer | Type | P-1 | P-1 | P-1 | P-1 | P-6 | Polyimide | P-1 |
| | | Parts by mass | 50 | 100 | 10 | 5 | 10 | 100 | 80 |
| | Curable compound | Type | Compound A | — | Compound B | Compound B | Compound B | — | Compound C |
| | | Parts by mass | 50 | — | 90 | 10 | 90 | — | 20 |
| | | Type | — | — | — | Compound D | — | — | — |
| | | Part by mass | — | — | — | 85 | — | — | — |
| | Curing aid | Type | Curing aid A | Curing aid A | Curing aid A | Curing aid A | Curing aid A | — | Curing aid A |
| | | Part by mass | 5 | 5 | 5 | 5 | 5 | — | 5 |
| | Solvent | Type | Solvent A | Solvent A | Solvent A | Solvent A | Solvent A | — | Solvent A |
| | | Part by mass | 160 | 160 | 160 | 160 | 160 | — | 160 |
| Metal layer/B-stage resin layer (/release layer) laminate | B-stage resin layer | Surface roughness Ra (nm) | 20 | 45 | 29 | 15 | 0.01 | — | 42 |
| | | Surface roughness Ra (nm) after peeling of release layer | — | 24 | 18 | 14 | 37 | — | 21 |
| | | Maximum elastic modulus at 50° C. or higher and lower than 80° C. (MPa) | — | 860 | 4 | 0.007 | 3 | — | 10 |
| | | Minimum value of elastic modulus (MPa) at 80° C. or higher and 200° C. or lower | — | 520 | 0.08 | 0.0004 | 3 | — | 15 |
| | Metal layer | Type | Electrolytic copper foil A | Electrolytic copper foil A | Electrolytic copper foil B | Electrolytic copper foil B | Electrolytic copper foil A | — | Electrolytic copper foil A |
| | | Surface roughness Ra (nm) | 110 | 110 | 350 | 350 | 110 | — | 110 |
| | | Thickness (μm) | 18 | 18 | 18 | 18 | 18 | — | 18 |

TABLE 1-continued

| | | | | | | | | | |
|---|---|---|---|---|---|---|---|---|---|
| High-frequency circuit laminate | C-stage resin layer | Thickness (μm) | 25 | 25 | 25 | 25 | 25 | 25 | 25 |
| | | Tensile strength (MPa) | 95 | 65 | 70 | 12 | 44 | 330 | 89 |
| | | Tensile elongation (%) | 4 | 11 | 11 | 250 | 6 | 80 | 3 |
| | | Tg (° C.) | 230 | 220 | 168 | 30 | 150 | — | 220 |
| | | Elastic modulus (GPa) | 1.8 | 3.5 | 0.3 | 0.05 | 0.2 | 3.4 | 2.4 |
| | | Relative permittivity | 2.6 | 2.5 | 3.2 | 2.9 | 3.2 | 3.3. | 2.9. |
| | | Dielectric loss tangent | 0.005 | 0.003 | 0.02 | 0.012 | 0.02 | 0.018 | 0.008 |
| | Metal layer | Type | Electrolytic copper foil A | Electrolytic copper foil A | Electrolytic copper foil B | Electrolytic copper foil B | Sputtered copper film | Electrolytic copper foil A | Electrolytic copper foil A |
| | | Surface roughness Ra (nm) | 110 | 110 | 350 | 350 | 3 | 110 | 110 |
| | | Thickness (μm) | 18 | 18 | 18 | 18 | 1 | 18 | 18 |
| | Lamination condition | Heating temperature (° C.) | 170 | 150 | 150 | 40 | 220 | 120 | 210 |
| | | Load (kN/m) | 13 | 10 | 20 | 10 | 0.5 | 10 | 10 |
| | Laminate properties | Laminate thickness (μm) | 61 | 61 | 61 | 61 | 44 | 60 | 61 |
| | | Peel strength (N/cm) | 8 | 4.7 | 7.8 | 4.9 | 3.3 | 5 | 6 |
| Circuit board evaluation | | Transmission loss (dB/100 mm) | −4.6 | −5.3 | −5.5 | −6.2 | −6.8 | −7.1 | −4.9 |
| | | Substrate step | Good | Poor | Poor | Poor | Poor | Good | Good |
| Laminate roll | Core | Material | ABS | SUS | SUS | Paper | SUS | Paper | Paper |
| | | Radius (mm) | 20 | 150 | 30 | 10 | 30 | 10 | 5 |
| | | Laminate roll evaluation | Good | Poor | Good | Poor | Good | Poor | Poor |

In Table 1, the following abbreviations are supplemented.
<Polymer>
  P-6: model number "PPO Resin Powder" available from Sabic, glass transition temperature (Tg): 215° C.
<Curable Compound>
  Compound A: 2,2'-bis (4-cyanatophenyl) propane (available from Tokyo Chemical Industry Co., Ltd.)
  Compound B: SR-16H (available from Sakamoto Yakuhin Kogyo Co., Ltd, epoxy equivalent; 160 g/eq)
  Compound C: HP-4032D (available from DIC, epoxy equivalent; 141 meq/g)
  Compound D: SR-4 PG (available from Sakamoto Yakuhin Kogyo Co., Ltd, epoxy equivalent; 305 g/eq)
<Curing Aid>
  Curing aid A: 1-benzyl-2-methylimidazole (available from Mitsubishi Chemical Corporation, product name "BMI 12")
  Curing aid B: zinc 2-ethyloctylate (available from Wako Pure Chemical Industries, Ltd.)
<Solvent>
  Solvent A: Cyclopentanone (available from Tokyo Chemical Industry Co., Ltd.)
  Solvent B: methylene chloride (available from Tokyo Chemical Industry Co., Ltd.)
<Metal Layer Type>
  Electrolytic copper foil A: product number "TQ-M4-VSP" available from Mitsui Mining & Smelting Co., Ltd.
  Electrolytic copper foil B: product number "3EC-M3S-HTE" available from Mitsui Mining & Smelting Co., Ltd.
  Rolled copper foil A: product number "GHY5-HA" available from JX Nippon Mining & Metals Corporation The results shown in Table 1 indicates that, when a circuit board was prepared using the high-frequency circuit laminates obtained in Examples 1 to 8, the transmission loss of electric signals in the high-frequency circuit was reduced, and a circuit board having excellent smoothness could be produced.

Furthermore, the results shown in Table 1 indicate that the laminate rolls obtained in Examples 1 to 8 can effectively suppress curling even when the high-frequency circuit laminate that reduces the transmission loss of electric signal in high-frequency circuits is wound around a core and stored.

REFERENCE SIGNS LIST

10. Release layer
11. Resin layer surface (exposed surface)
12. B-stage resin layer
13. Resin layer surface (exposed surface)
14. Metal layer
16. Metal layer
18. C-stage resin layer
20. Metal layer
22. B-stage resin layer
23. Resin layer surface (exposed surface)
24. Metal layer
26. C-stage resin layer
30. Core
32. Step
40. High-frequency circuit laminate 41. impression (curling)
100. High-frequency circuit laminate
200. High-frequency circuit laminate
300. Laminate roll

What is claimed is:

1. A high-frequency circuit laminate, comprising:
a metal layer; and
a resin layer,
wherein the metal layer and the resin layer are laminated in contact with each other,
wherein the resin layer comprises a polymer comprising a repeating unit of formula (1-1), a repeating unit of formula (1-2), and/or a repeating unit of formula (1-3)

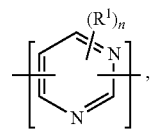    (1-1)

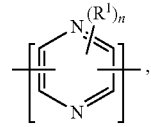    (1-2)

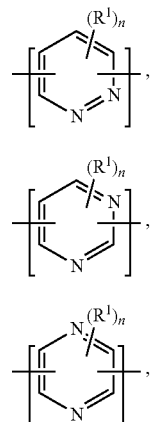    (1-3)

wherein in the formulas (1-1) to (1-3), $R^1$ is independently a halogen atom, a monovalent hydrocarbon group comprising 1 to 20 carbon atoms, a monovalent halogenated hydrocarbon group comprising 1 to 20 carbons, a nitro group, a cyano group, a primary amino group optionally as a salt, a secondary amine group optionally as a salt, or a tertiary amino groups optionally as a salt, n is independently an integer in a range of from 0 to 2, wherein when n is 2, the plurality of R1s optionally differ, and are optionally bonded in any combination to form part of a ring structure,
wherein the resin layer has an elastic modulus ranges from 0.1 to 3 GPa, and
wherein the resin layer has a dielectric loss tangent in a range of from 0.001 to 0.01 and a relative permittivity in as range of from 2 to 3 at a frequency of 10 GHz at 23° C.

2. The laminate of claim 1, wherein a peel strength between the resin layer and the metal layer is 5 N/cm or greater.

3. The laminate of claim 1, wherein the resin layer has a thickness in a range of from 10 to 100 μm, and
wherein the metal layer has a thickness in a range of from 10 to 50 μm.

4. The laminate of claim 1, having a thickness in a range of from 50 to 200 μm.

5. A flexible printed circuit board, comprising:
the high-frequency circuit laminate of claim 1.

6. A laminate roll, comprising:
the high-frequency circuit laminate of claim 1,
wherein the high-frequency circuit laminate is wound around a core having a radius in a range of from 10 to 100 mm.

7. A method for producing a high-frequency circuit laminate, the method comprising:
bonding a B-stage resin layer having a surface roughness Ra in a range of from 1 to 100 nm to a metal layer having a surface roughness Ra in a range of from 10 to 300 nm by heating in a range of from 50 to 200° C. under a linear load in a range of from 1 to 19 kN/m,
wherein the B-stage resin layer comprises a polymer comprising a repeating unit of formula (1-1), a repeating unit of formula (1-2), and/or a repeating unit of formula (1-3)

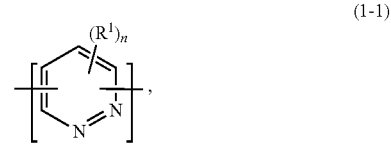    (1-1)

    (1-2)

    (1-3)

wherein in the formulas (1-1) to (1-3), $R^1$ is independently a halogen atom, a monovalent hydrocarbon group comprising 1 to 20 carbon atoms, a monovalent halogenated hydrocarbon group comprising 1 to 20 carbons, a nitro group, a cyano group, a primary amino group optionally as a salt, a secondary amine group optionally as a salt, or a tertiary amino groups optionally as a salt, n is independently an integer in a range of from 0 to 2, wherein when n is 2, the plurality of $R^1$s optionally differ, and are optionally bonded in any combination to form part of a ring structure.

8. A B-stage sheet, comprising:
a B-stage resin layer; and
a release layer formed on at least one surface of the B-stage resin layer,
wherein the B-stage resin layer comprises a polymer comprising a repeating unit of formula (1-1), a repeating unit of formula (1-2), and/or a repeating unit of formula (1-3)

    (1-1)

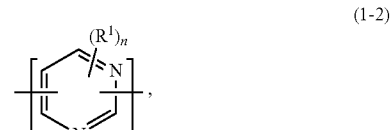    (1-2)

-continued (1-3)

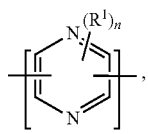

wherein in the formulas (1-1) to (1-3), $R^1$ is independently a halogen atom, a monovalent hydrocarbon group comprising 1 to 20 carbon atoms, a monovalent halogenated hydrocarbon group comprising 1 to 20 carbons, a nitro group, a cyano group, a primary amino group optionally as a salt, a secondary amine group optionally as a salt, or a tertiary amino groups optionally as a salt, n is independently an integer in a range of from 0 to 2, wherein when n is 2, the plurality of $R^1$s optionally differ, and are optionally bonded in any combination to form part of a ring structure, wherein the B-stage resin layer is cured to become a C-stage resin layer having an elastic modulus in a range of from 0.1 to 3 GPa, and wherein the C-stage resin layer has a dielectric loss tangent in a range of from 0.001 to 0.01 and a relative permittivity in a range of from 2 to 3 at a frequency of 10 GHz at 23° C.

9. The laminate of claim 1, wherein the polymer further comprises a repeating unit of formula (2):

(2)

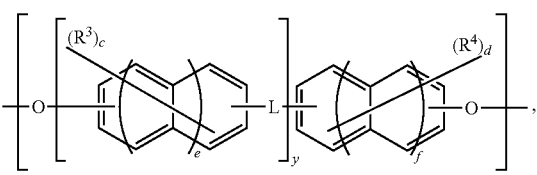

wherein, in the formula (2), $R^3$ and $R^4$ are independently a halogen atom, a nitro group, a cyano group, or a monovalent organic group comprising 1 to 20 carbon atoms, c and d are independently an integer in a range of from 0 to 8, e, f, and y are independently an integer from 0 to 2, and L is a single bond, —O—, —S—, —CO—, —SO—, —SO$_2$—, or a divalent organic group comprising 1 to 20 carbon atoms.

10. The method of claim 7, wherein the polymer further comprises a repeating unit of formula (2):

(2)

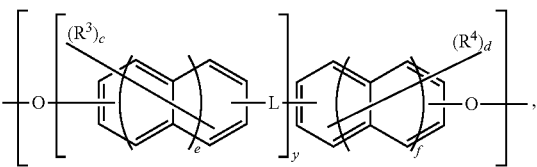

wherein, in the formula (2), $R^3$ and $R^4$ are independently a halogen atom, a nitro group, a cyano group, or a monovalent organic group comprising 1 to 20 carbon atoms, c and d are independently an integer in a range of from 0 to 8, e, f, and y are independently an integer from 0 to 2, and L is a single bond, —O—, —S—, —CO—, —SO—, —SO—, or a divalent organic group comprising 1 to 20 carbon atoms.

11. The B-stage sheet of claim 8, wherein the polymer further comprises a repeating unit of formula (2):

(2)

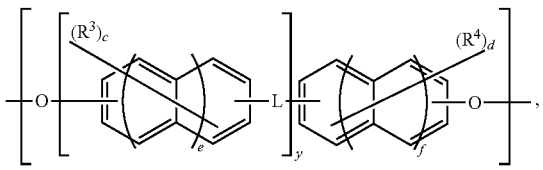

wherein, in the formula (2), $R^3$ and $R^4$ are independently a halogen atom, a nitro group, a cyano group, or a monovalent organic group comprising 1 to 20 carbon atoms, c and d are independently an integer in a range of from 0 to 8, e, f, and y are independently an integer from 0 to 2, and L is a single bond, —O—, —S—, —CO—, —SO—, —SO—, or a divalent organic group comprising 1 to 20 carbon atoms.

12. The laminate of claim 1, wherein the polymer comprises the repeating unit of formula (1-1).

13. The laminate of claim 1, wherein the polymer comprises the repeating unit of formula (1-2).

14. The laminate of claim 1, wherein the polymer comprises the repeating unit of formula (1-3).

15. The laminate of claim 1, wherein the polymer has a weight average molecular weight in a range of from 30000 to 600000.

16. The laminate of claim 1, wherein the polymer has a glass transition temperature in a range of from 150 to 320° C.

17. The laminate of claim 1, wherein the polymer has a glass transition temperature in a range of from 180 to 300° C.

18. The laminate of claim 1, wherein, in formulas (1-1) to (1-3), n is 0.

19. The laminate of claim 9, wherein, in the formula (2), L is the divalent organic group comprising 1 to 20 carbon atoms.

20. The laminate of claim 1, wherein the polymer comprises, as a structural repeating unit,

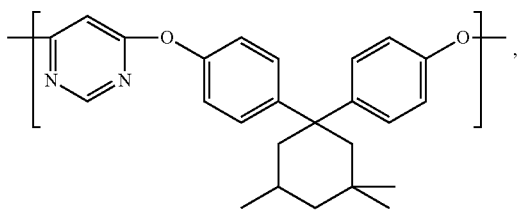

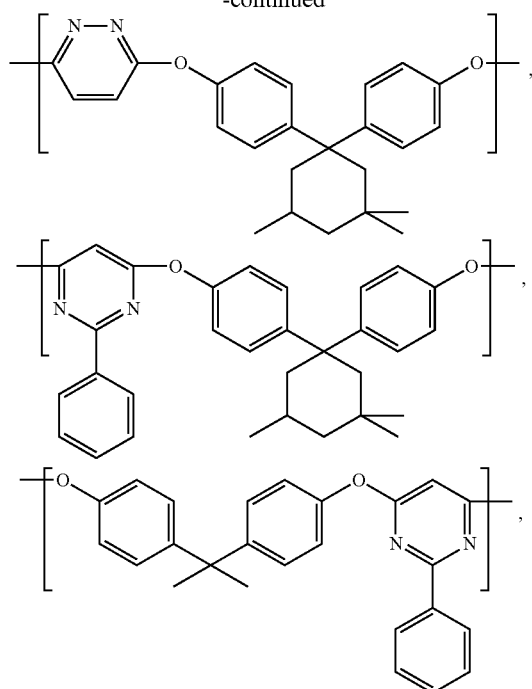
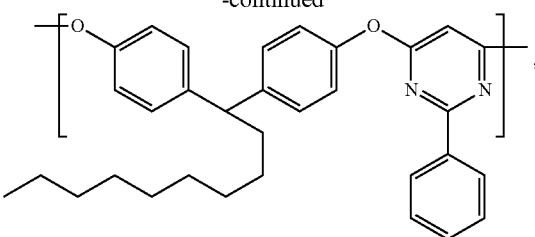
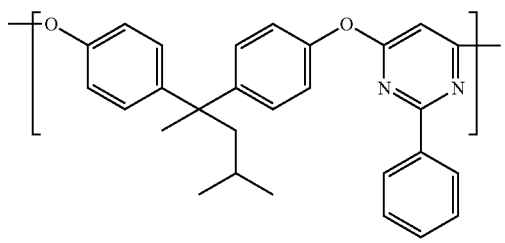
and/or
* * * * *